United States Patent
Oka et al.

[11] Patent Number: 6,132,865
[45] Date of Patent: *Oct. 17, 2000

[54] ADHESIVE TAPE FOR ELECTRONIC PARTS

[75] Inventors: Osamu Oka; Jun Tochihira; Fumiki Komagata, all of Shizuoka, Japan

[73] Assignee: Tomoegawa Paper Co., Ltd., Tokyo, Japan

[ * ] Notice: This patent is subject to a terminal disclaimer.

[21] Appl. No.: 09/118,022

[22] Filed: Jul. 17, 1998

[30] Foreign Application Priority Data

Jul. 23, 1997 [JP] Japan .................................. 9-212442

[51] Int. Cl.$^7$ .............................. B32B 7/12; C09J 179/08
[52] U.S. Cl. .................... 428/344; 428/355 N; 428/447; 428/355 CN; 428/473.5; 528/26; 528/353
[58] Field of Search ............................ 428/344, 355 CN, 428/355 N, 473.5, 447; 528/26, 353

[56] References Cited

U.S. PATENT DOCUMENTS 4,063,984  12/1977  Critchley .......................... 428/473.5 X (List continued on next page.)

FOREIGN PATENT DOCUMENTS

| 6-291236 | 10/1994 | Japan . |
| 325533 | of 1996 | Japan . |
| 67559 | of 1997 | Japan . |
| 140106 | of 1998 | Japan . |

*Primary Examiner*—Daniel Zirker
*Attorney, Agent, or Firm*—McDermott, Will & Emery

[57] ABSTRACT

An adhesive tape for electronic parts which comprises a metal substrate and an adhesive layer A and an adhesive layer B laminated in order on at least one side of said metal substrate, wherein said adhesive A comprises a polyimide consisting of 100 –20% by mol of the repeating unit represented by the following formula (1a) and 0–80% by mol of the repeating unit represented by the following formula (1b), said adhesive B comprises a polyimide consisting of 100–40% by mol of the repeating unit represented by the following formula (1a) and 0–60% by mol of the repeating unit represented by the following formula (2), and the adhesive layer A and the adhesive layer B have each a different glass transition temperature:

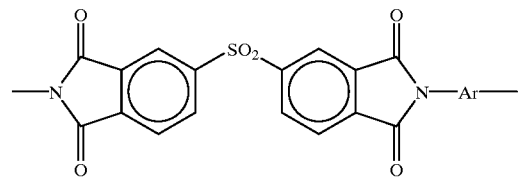

(1a)

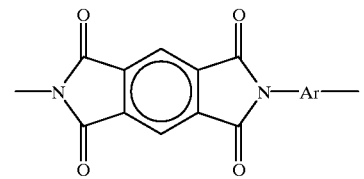

(1b)

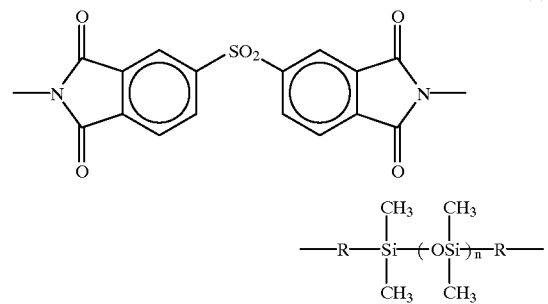

(2)

wherein Ar represents a divalent group selected from the specified structures containing aromatic rings, R is an alkylene group having 1 to 10 carbon atoms or —$CH_2OC_6H_4$—, the methylene group of which attaches to Si, and n means an integer of 1 to 20.

8 Claims, 1 Drawing Sheet

U.S. PATENT DOCUMENTS

| | | | |
|---|---|---|---|
| 5,300,627 | 4/1994 | Kunimune et al. | 428/353 |
| 5,508,357 | 4/1996 | Matsuura et al. | 525/420 |
| 5,510,425 | 4/1996 | Matsuura et al. | 525/423 |
| 5,851,616 | 12/1998 | Oka et al. | 428/41.8 |
| 5,866,250 | 2/1999 | Oka et al. | 428/355 CN |
| 5,891,540 | 4/1999 | Oka | 428/40.1 |

ADHESIVE TAPE FOR ELECTRONIC PARTS

BACKGROUND OF THE INVENTION

1. Field of the Invention

The present invention relates to adhesive tapes for electronic parts to be used as adhesive tapes for fixing the leadframe, TAB tapes or for adhering between parts around leadframes making up a semiconductor device, e.g., lead pins, semiconductor chip mounted substrates, heat spreader, semiconductors themselves.

2. Description of the Related Art

Conventionally, adhesive tapes for fixing leadframes, TAB tapes, etc., are used as adhesive tapes for use in the interior of resin-molded type semiconductor devices. For example, the adhesive tapes for fixing leadframes have been used to fix lead pins of a leadframe in order to enhance the efficiency for producing the leadframe itself and the whole semiconductor assembly stages. In general, a leadframe manufacturer tapes the leadframe, and brings it to a semiconductor manufacturer, at which a semiconductor chip is mounted thereon followed by molding the leadframe with a resin. For this reason, it has been required for the adhesive tapes for fixing the lead frame not only to possess general reliability in a level required for semiconductor and enough processability at the time of taping, but also to possess sufficient adhesive strength at room temperature immediately after taping and heat resistance enough for withstanding thermal process at the stages of assembling semiconductor devices.

Conventionally, the adhesive tapes for use in such an application include adhesive tapes applying on a support film of a polyimide film, etc., an adhesive comprising polyacrylonitrile, polyacrylate or a synthetic rubber resin such as acrylonitrile-butadiene copolymer solely, or modified with any other resin or blended with any other resin to come into a B-stage. Both-sided adhesive tapes using thermoplastic polyimide resin having high reliability and high heat resistance have been utilized recently.

In recent years, resin-molded type semiconductor devices (semiconductor packages) as shown in FIG. 3 have been developed and produced. In FIG. 3, the device has a construction in which lead pins 3 and a metal plane 2 are connected by means of an adhesive layer 6, a semiconductor chip 1 is mounted on the metal plane 2, and together with bonding wires 4 between the semiconductor chip 1 and the lead pins 3, they are molded with a resin 5. In general, unilayer adhesive film or both-sided adhesive tape is used as the adhesive layer 6.

In the adhesive layer in the resin-molded type semiconductor devices shown in FIG. 3, the use of an adhesive tape to which a conventional adhesive is applied has the problems that the generated gas stains the lead to cause deterioration of the adhesive strength or causes generation of package crack, because of insufficient heat resistance. It is therefore required to develop adhesives for electronic parts having sufficient heat resistance and reliability and adhesive tapes for electronic parts using them.

The present inventor has solved before the above problems by inventing adhesive tapes using an adhesive containing a polyimide composed of repeating units represented by the below-described formulas (1a) and (2). (Japanese Patent Application Laid-open Nos. 325533/1996 and 67559/1997).

These adhesive tapes however have other various problems. For example, there is a problem of easily causing interfacial separation of the adhesive layer from the heat resistant film in the case that the adhesive layer is formed on a heat resistant film. In particular, the interfacial separation at high humidity and high temperature becomes a serious problems because of causing remarkable deterioration of reliability of semiconductor packages. In the case of an adhesive tape consisting only of an adhesive layer, there is the problem that insulation becomes difficult to assure when the tape is bonded under pressure with heat, because the leadframe is embedded in and pierces the adhesive layer.

In the prior semiconductor devices, the leadframe and the plane previously prepared are bonded under pressure with heat by means of a both-sided adhesive tape which was cut by means of a dies. It is therefore necessary to change the dies for cutting the adhesive tape according to the shapes of the leadframe and the plane, by which the process requires many production stages to increase the price of the semiconductor device.

Japanese Patent Application Laid-open No. 291236/1994 discloses a method of bonding the heat radiator to the lead frame in the semi-conductor device with an adhesive tape comprising polyimide adhesive layers having each a different glass transition temperature (Tg). However, there is no detailed description concerning component of the adhesive to be used. Since adhesives have each a different molecular structure, the disclosed semiconductor device has the problem that interfacial separation between or on the adhesive layers is easily caused to result in insufficient adhesion between the adhesive layers and insufficient electric reliability.

It is further proposed to laminate adhesive layers on a metal foil or plate, whereby the insulation is secured from the adhesive layer near to the metal foil or plate and the adhesion is secured from the other adhesive layer. By the way, the adhesive layer for fixing the leadframe is required to be composed of a resin having a relatively low Tg in view of preventing oxidation of the leadframe, preventing appearance of strains and shortening an operation time for bonding. However, when the glass transition temperature of the resin is too low, there cause problems that the lead pin moves during assembling stages of the semiconductor and package cracks easily occur. On the other hand, when the resin is designed to have a higher glass transition temperature, it requires a higher temperature for bonding, or it is necessary a long period of operation time for bonding when the bonding is conducted at a low temperature for avoiding oxidation.

Japanese Patent Application Laid-open No. 140106,/1998 discloses an adhesive tape for electronic parts comprising laminated adhesive layers of specified polyimides having each a different glass transition temperature. This adhesive tape had a problem that viscosity of the lower Tg adhesive layer became low to cause variation of thickness of the adhesive layer when the adhesive tape was bonded to the metal plate. On the other hand, when the metal plate was bonded to the higher Tg adhesive layer of the adhesive tape after the lower Tg adhesive layer was bonded to the leadframe, there caused a problem that the lead pins embedded into the lower Tg adhesive layer to cause shifting or lifting of the lead pins, shorting etc., because a higher temperature and a higher pressure were necessary for bonding under pressure.

The present invention has been made for the purpose of solving such problems in the prior arts. Namely, an object of the present invention is to provide an adhesive tape for electronic parts capable of adhesion at a relatively low temperature for a short time without generating gas and causing interfacial separation, with keeping electrical insulation and having sufficient reliability.

SUMMARY OF THE INVENTION

The first adhesive tape for electronic parts of the present invention is characterized by comprising a metal substrate and an adhesive layer A and an adhesive layer B laminated in order on at least a surface of said metal substrate, wherein said adhesive A comprises a polyimide consisting of 100–20% by mol of the repeating unit represented by the following formula (1a) and 0–80% by mol of the repeating unit represented by the following formula (1b), said adhesive B comprises a polyimide consisting of 100–40% by mol of the repeating unit represented by the following formula (1a) and 0–60% by mol of the repeating unit represented by the following formula (2), and the adhesive layer A and the adhesive layer B have each a different glass transition temperature:

(1a)

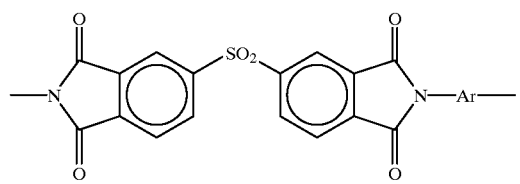

(1b)

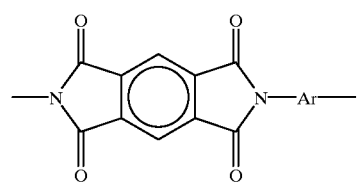

wherein Ar represents a divalent group selected from the following formulas containing aromatic rings:

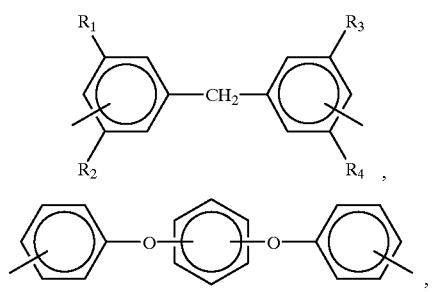

-continued

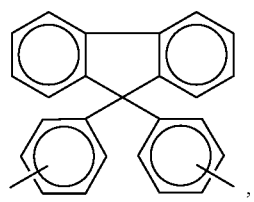

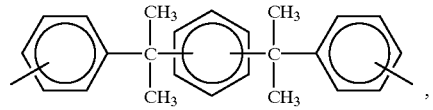

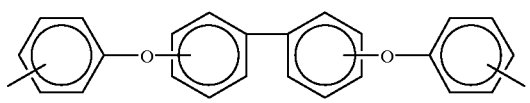

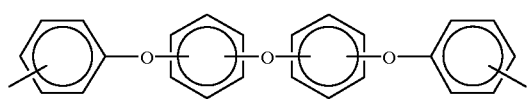

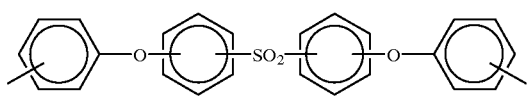

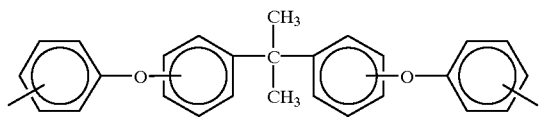

and

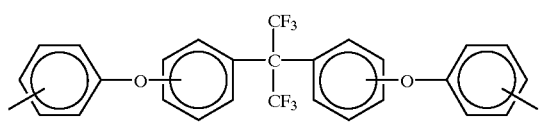

wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time:

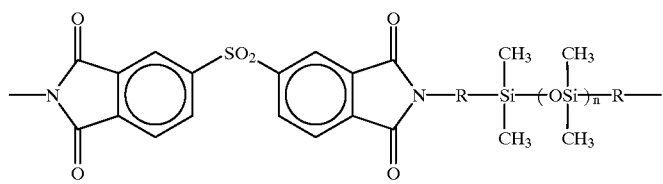

(2)

wherein R is an alkylene group having 1 to 10 carbon atoms or —$CH_2OC_6H_4$—, the methylene group of which attaches to Si, and n means an integer of 1 to 20.

The second adhesive tape for electronic parts of the present invention is characterized by comprising a metal substrate and an adhesive layer A, adhesive layer B and an adhesive layer C laminated in order on at least a surface of said metal substrate, wherein said adhesive A comprises a polyimide consisting of 100–20% by mol of the repeating unit represented by the above formula (1a) and 0–80% by mol of the repeating unit represented by the above formula (1b), said adhesive B comprises a polyimide consisting of 100–40% by mol of the repeating unit represented by the above formula (1a) and 0–60% by mol of the repeating unit represented by the above formula (2), said adhesive C comprises a polyimide consisting of 90–40% by mol of the repeating unit represented by the following formula (3a) and 10–60% by mol of the repeating unit represented by the following formula (3b), and the adhesive layer A, the adhesive layer B and the adhesive layer C have each a different transition temperature:

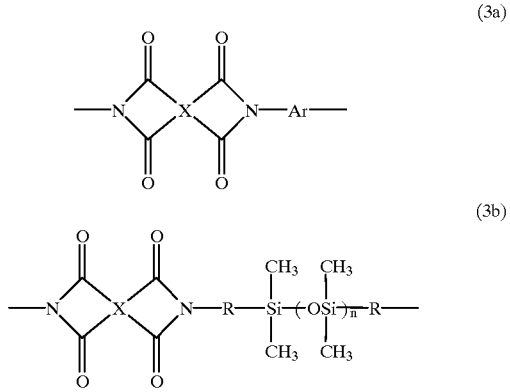

(3a)

(3b)

wherein X is a tetravalent aromatic group selected from the group consisting of 3,3',4,4'-diphenyl sulfone structure, 3,3', 4,4'-biphenyl structure and 2,3',3,4'-biphenyl structure, and Ar and R represent each the same meaning as described above.

DETAILED DESCRIPTION OF PREFERRED EMBODIMENTS

The embodiments of the present invention will now be described in detail.

Figure 1:
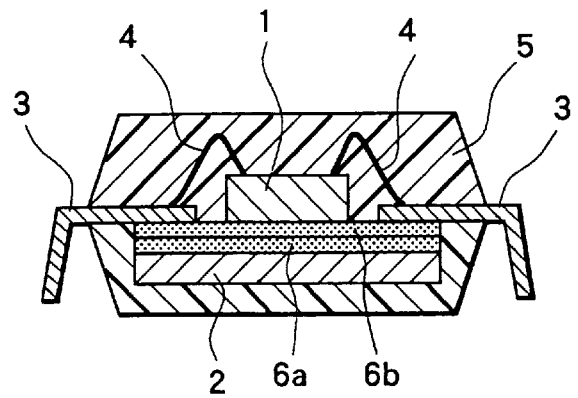
FIG. 1 is a cross-sectional view of an embodiment of a resin-molded type semiconductor device using the first adhesive tape of the present invention.
Figure 2:
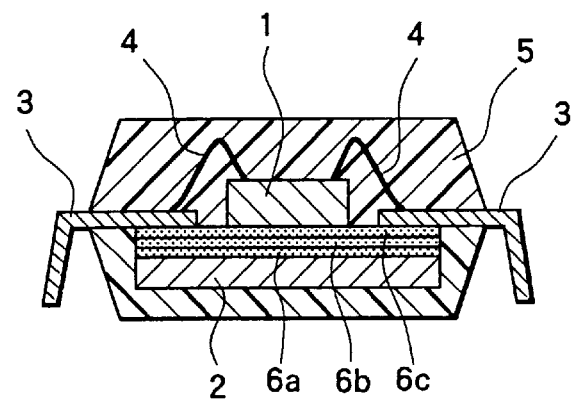
FIG. 2 is a cross-sectional view of an embodiment of a resin-molded type semiconductor device using the second adhesive tape of the present invention.
Figure 3:
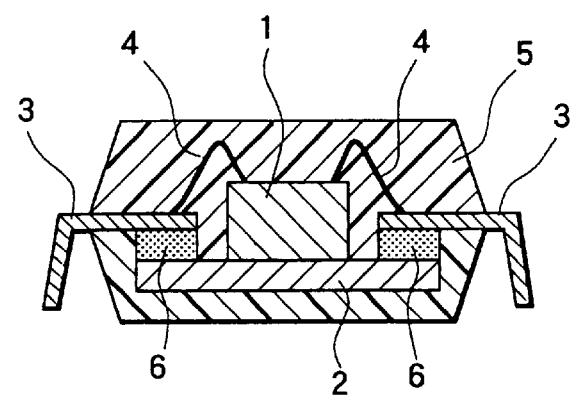
FIG. 3 is a cross-sectional view of an embodiment of a resin-molded type semiconductor device using an adhesive tape of the conventional adhesive tape.

In FIG. 1 and FIG. 2, the lead pins 3 and the metal substrate 2 of the adhesive tape are connected by means of adhesive layers A and B (6a and 6b) or A, B and C (6a, 6b and 6c) having each a different glass transition temperature which are composed of the above mentioned polyimides, a semiconductor chip 1 is mounted on the metal substrate 2, and they are molded with a resin 5 together with bonding wires 4 between the semiconductor chip 1 and the lead pins 3.

The metal substrate used in the present invention is not restricted so far as it has heat radiation ability. The metal substrate is preferred to have the thickness of from 10–300 μm, which is composed of at least one selected from the group consisting of copper, cupro-nickel, silver, iron, 42-alloy and stainless steel.

The adhesive layer A in the first and the second adhesive tapes of the present invention comprises one or more of polyimides consisting of 100–20% by mol and preferably 80–20% by mol of the repeating unit represented by the above formula (1a) and 0–80% by mol and preferably 80–20% by mol of the repeating unit represented by the above formula (1b). In the present invention, these polyimides may comprise two or more species of the above repeating unit (1a) or may comprise two or more species of the above repeating unit (1b).

In the above described polyimide used in the adhesive layer A, the greater the proportion of the repeating units represented by the formula (1a) is, the lower the glass transition temperature becomes, while the greater the proportion of the repeating units represented by the formulas (1b) is, the higher the glass transition temperature becomes. Accordingly, it is possible to control the glass transition temperature of the polyimide by varying the proportion of the formulas (1a) and (1b), by which it becomes possible to control a temperature of initiating flow of the adhesive layer A so as to secure sufficient electrical insulation under the bonding condition of the adhesive layer B.

The adhesive layer B in the first and the second adhesive tapes of the present invention comprises one or more of polyimides consisting of 100–40% by mol of the repeating unit represented by the above formula (1a) and 0–60% by mol of the repeating unit represented by the above formula (2). In the present invention, these polyimides may comprise two or more species of the above repeating unit (1a) or may comprise two or more species of the above repeating unit (2).

In the above described polyimide used in the adhesive layer B, the greater the proportion of the repeating units represented by the formula (1a) is, the higher the glass transition temperature becomes, while the greater the proportion of the repeating units represented by the formulas (2) is, the lower the glass transition temperature becomes, and adhesion to the adhesive layer A is improved. Accordingly, it is possible to control the glass transition temperature of the polyimide by varying the proportion of the formulas (1a)

and (2), by which it becomes possible to control the temperature capable of bonding with pressure.

The adhesive layer B is preferred to contain at least a bisimide compound selected from compounds represented by the following formulas (4a) and (4b):

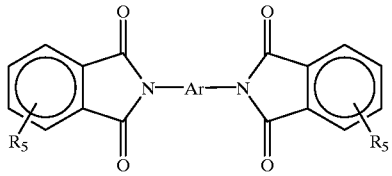
(4a)

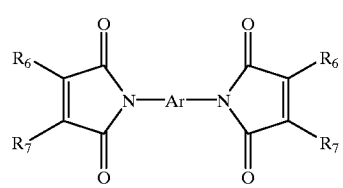
(4b)

wherein Ar has the same meaning as described above, $R_5$, $R_6$ and $R_7$ which are the same or different represent each a hydrogen atom, a chlorine atom, a bromine atom a carboxyl group, an alkyl group having 1–4 carbon atoms or an alkoxy group having 1–4 carbon atoms.

A preferable amount of the bisimide compound in the adhesive layer B is in a range of from 1 to 100 parts by weight based on 100 parts by weight of the polyimide. By addition of the bisimide compound, it becomes to reduce the temperature capable of bonding with pressure as compared with the case of using polyimide alone. In other words, it becomes possible to shorten the time necessary to bonding with pressure as compared with the case of the adhesive layer B composed of only a polyimide consisting of the formulas (1a) and (2), by which oxidation of the leadframe and the metal substrate can be prevented. Particularly excellent effect of improving adhesion can be obtained when one of $R_5$, $R_6$ and $R_7$ is carboxyl group.

The adhesive layer C in the second adhesive tape of the present invention comprises a polyimide consisting of 90–40% by mol of the repeating unit represented by the above formula (3a) and 10–60% by mol of the repeating unit represented by the above formula (3b). In the present invention, the polyimide may comprise two or more species of the above repeating unit (3a) or may comprise two or more species of the above repeating unit (3b).

In the above described polyimide used in the adhesive layer C, the greater the proportion of the repeating unit represented by the formulas (3b) is or the longer the repeating unit (OSi) is, the lower the glass transition temperature becomes, by winch adhesion to the adhesive layer B is improved. Accordingly, it is possible to control the glass transition temperature of the polyimide by varying the proportion of the formulas (3a) and (3b) or by controlling the length of siloxane chain, by which it becomes possible to control the temperature capable of bonding with pressure of the adhesive layer C. In the present invention, it is necessary for the adhesive layer C to adhere with pressure at a relatively low temperature, that is, at 100–180° C. to the leadframe. Therefore, the polyimide having a glass transition temperature of 150° C. is preferred and particularly that having a glass transition temperature of 100° C. or less is more preferred.

The polyimides to be used in the first and the second adhesive tapes of the present invention can be produced according to conventional processes for producing polyimides. In detail, they can be produced from tetracarboxylic dianhydrides corresponding to the desired repeating units and diamines or diisocyanates corresponding to the desired repeating units.

In more detail, the above polyimide to be used in the adhesive layer A can be produced by reacting 3,3',4,4'-diphenylsulfone tetracarboxylic dianhydride and pyromellitic dianhydride as tetracarboxylic dianhydrides with a compound represented by the following formula (5):

Y—Ar—Y (5)

wherein Ar is the same meaning as described above and Y is an amino group or an isocyanate group.

The above polyimide to be used in the adhesive layer B can be produced by reacting 3,3',4,4'-diphenylsulfone tetracarboxylic dianhydride as tetracarboxylic dianhydride with a compound represented by the above mentioned formula (5) and a siloxane compound represented by the following formula (6):

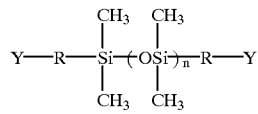
(6)

wherein R is an alkylene group having 1 to 10 carbon atoms or $-CH_2OC_6H_4-$, the methylene group of which attaches to Si, Y is an amino group or an isocyanate group, and n means an integer of 1 to 20.

The above polyimide to be used in the adhesive later C can be produced by reacting 3,3',4,4'-diphenylsulfone tetracarboxylic dianhydride, 3,3',4,4'-biphenyl tetra-carboxylic dianhydride or 2,3', 3,4'-biphenyl tetracarboxylic dianhydride as tetracarboxylic dianhydrides with a compound represented by the above mentioned formula (5) and a siloxane compound represented by the above mentioned formula (6).

In the present invention, the above polyimides may be prepared using two or more of the compounds represented by the above mentioned formula (5) or may be prepared using two or more of the siloxane compound represented by the above mentioned formula (6).

The compound represented by the formula (5) to be used as a raw material for production of the polyimides has a divalent group Ar selected from the above described structures having aromatic rings. Typical examples of the compound wherein the functional group Y is an amino group include the following diamines:

3,3'-diaminodiphenylmethane, 3,4'-diaminodiphenylmethane,
4,4'-diaminodiphenylmethane, 1,3-bis[1-(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,4-bis[1-(4-aminophenyl)-1-methylethyl]benzene, 1,3-bis(4-amino-α,α-dimethylbenzyl)benzene, 1,3-bis(3-aminophenoxy)benzene,
1,3-bis(4-aminophenoxy)benzene, 1,4-bis(3-aminophenoxy)benzene, 1,4-bis(4-aminophenoxy)benzene,
3,3'-bis(3-aminophenoxy)diphenyl ether,
3,3'-bis(4-aminophenoxy)diphenyl ether,
3,4'-bis(3-aminophenoxy)diphenyl ether,
3,4'-bis(4-aminophenoxy)diphenyl ether, 4,4'-bis(3-aminophenoxy)diphenyl ether,
4,4'-bis(4-aminophenoxy)diphenyl ether,
3,3,-bis(3-aminophenoxy)biphenyl, 3,3'-bis(4-aminophenoxy)-biphenyl, 3,4'-bis(3-aminophenoxy) biphenyl,
3,4'-bis(4-aminophenoxy)biphenyl, 4,4'-bis(3-aminophenoxy)biphenyl, 4,4'-bis(4-aminophenoxy) biphenyl,
bis[4-(3-aminophenoxy)phenyl]sulfone,
bis[4-(4-aminophenoxy)phenyl]sulfone,
2,2-bis[3-(3-aminophenoxy)phenyl]propane,
2,2-bis[3-(4-aminophenoxy)phenyl]propane,
2,2-bis[4-(3-aminophenoxy)phenyl]propane,
2,2-bis[4-(4-aminophenoxy)phenyl]propane,
2,2-bis[3-(3-aminophenoxy)phenyl]hexafluoropropane,
2,2-bis[3-(4-aminophenoxy)phenyl]hexafluoropropane,
2,2-bis[4-(3-aminophenoxy)phenyl]hexafluoropropane,
2,2-bis[4-(4-aminophenoxy)phenyl]hexafluoropropane,
9,9-bis(3-aminophenyl)fluorene,
9,9-bis(4-aminophenyl)fluorene,
3,3'-diamino-2,2',4,4'-tetramethyldiphenylmethane,
3,3'-diamino-2,2',4,4'-tetraethyldiphenylmethane,
3,3'-diamino-2,2',4,4'-tetrapropyldiphenylmethane,
3,3'-diamino-2,2',4,4'-tetraisopropyldiphenylmethane,
3,3'-diamino-2,2',4,4'-tetrabutyldiphenylmethane,
3,4'-diamino-2,3',4,5'-tetramethyldiphenylmethane,
3,4'-diamino-2,3',4,5'-tetraethyldiphenylmethane,
3,4'-diamino-2,3',4,5'-tetrapropyldiphenylmethane,
3,4'-diamino-2,3',4',5-tetraisopropyldiphenylmethane,
3,4'-diamino-2,3',4',5-tetrabutyldiphenylmethane,
4,4'-diamino-3,3',5,5'-tetramethyldiphenylmethane,
4,4'-diamino-3,3',5,5'-tetraethyldiphenylmethane,
4,4'-diamino-3,3',5,5'-tetrapropyldiphenylmethane,
4,4'-diamino-3,3',5,5'-tetraisopropyldiphenylmethane,
4,4'-diamino-3,3',5,5'-tetrabutyldiphenylmethane,
4,4'-diamino-3,3'-diethyl-5,5'-dimethyldiphenylmethane,
4,4'-diamino-3,3'-dimethyldiphenylmethane,
4,4'-diamino-3,3'-diethyldiphenylmethane,
4,4'-diamino-3,3',5,5'-tetramethoxydiphenylmethane,
4,4'-diamino-3,3',5,5'-tetraethoxydiphenylmethane,
4,4'-diamino-3,3',5,5'-tetrapropoxydiphenylmethane,
4,4'-diamino-3,3',5,5'-tetraisopropoxydiphenylmethane,
4,4'-diamino-3,3',5,5'-tetrabutoxydiphenylmethane,
4,4'-diamino-3,3'-dimethoxydiphenylmethane,
4,4'-diamino-3,3'-diethoxydiphenylmethane and the like.

Examples of diisocyanates which are the compounds represented by the formula (5) wherein the functional group Y is an isocyanate group include those exemplified in the above mentioned diamines in which "amino" is replaced by "isocyanate".

Typical examples of the siloxane compound represented by the formula (6) to be used as a raw material for production of the polyimide wherein the functional group Y is an amino group include the following diamines: bis(3-aminopropyl)tetramethyldisiloxane, bis(10-aminodecamethylene) tetramethyldisiloxane, aminopropyl terminated dimethylsiloxane tetramer and octamer, bis(3-aminophenoxymethyl) tetramethyldisiloxane and the like. These siloxane compounds may be used as a mixture of two or more thereof.

Examples of diisocyanates which are the siloxane compounds represented by the formula (6) wherein the functional group Y is an isocyanate group include those exemplified in the above mentioned diamines in which "amino" is replaced by "isocyanate".

The diisocyanates wherein the functional group Y in the above mentioned formulas (5) and (6) is an isocyanate group can be easily produced by reacting the above exemplified corresponding diamine with phosgene.

The polyimides of the present invention can be produced as follows.

Examples of processes for producing the polyimide using tetracarboxylic dianhydrides and diamines as the raw materials for thepolyimide include the following. A process for directly producing the polyimide by heating tetracarboxcylic dianhydrides and diamines in an organic solvent, optionally in the presence of a catalyst (in an amount of not more than 20 parts by weight of the reactants) such as tributylamaine, triethylamine, or triphenyl phosphite to a temperature of not less than 100° C., and preferably not less than 180° C. A process for obtaining a polyimide by reacting tetracarboxylic dianhydrides with diamines in an organic solvent at a temperature of not more than 100° C. to obtain a polyamic acid which is a precursor of the polyimide, optionally adding a dehydration catalyst such as p-toluenesulfonic acid (in an amount of 1 to 5 times the mol of the tetracarboxylic dianhydride), and then heating the solution to cause an imidation reaction. A process in which the above-mentioned polyamic acid is caused to a ring-closure reaction at a relatively low temperature (in a range from room temperature to 100° C.) by adding dehydrating ring-closure agent such as an anhydride, e.g., acetic anhydride, propionic anhydride or benzoic anhydride, a carbodiimide compound, e.g., dicyclohexylcarbodiimide, and optionally a ring closing catalyst such as pyridine, isoquinoline, imidazole and triethylamine (as for the dehydration ring-closure agent and ring-closure catalyst, in an amount of 2 to 10 times the mol of the tetracarboxylic dianhydride).

Examples of the organic solvents used in the above mentioned reactions include aprotic polar solvents such as N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, and phenol solvents such as phenol, cresol, xylenol, and p-chlorophenol. Optionally, solvents such as benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichloroethylene, and nitrobenzene can be mixed with the above-mentioned solvents as a mixture.

In the case where tetracarboxylic dianhydrides and diisocyanates are used as the raw materials, the product is possible to obtain according to the process for directly producing the polyimide as described above. In this case, the reaction temperature is preferably not less than room temperature, and particularly not less than 60° C. The polyimide having a high polymerization degree can be produced by the reaction between equimolar amounts of the tetracarboxylic dianhydrides and the diamines or diisocyanates. If necessary, either of them is capable of using in an excess amount of less than 10% by mol.

Since the film formability depends upon molecular weight of the polyimide used in the present invention, the molecular weight can be optimally decided according to desired film formability. When being used in the present invention, polyimide having too low molecular weight is not preferred, because film formability in some degree is required in the adhesive layer even in the case of the liquid form and the heat resistance is also lowered. In the present invention, the molecular weight is required to be not less than 4,000. When being used as a thermoplastic adhesive, the adhesion is changed for the worse, if the viscosity during the melting is too high. The molecular weight is a factor for controlling the viscosity during the melting. In the case of the polyimide used in the present invention, number molecular weight is approximately not more than 400,000. If the molecular weight is higher than this value, it becomes difficult to use as the adhesive because of increasing the viscosity.

The bisimide compounds to be added to the adhesive Layer B for controlling the temperature for bonding and the glass transition temperature can be produced according to conventional processes for producing bisimides. They can be produced from diamines or diisocyanates corresponding to the desired structure and tetracarboxylic dianhydrides.

In detail, the bisimide compound represented by the above formula (4a) can be produced by reacting a phthalic anhydride derivative such as phthalic anhydride, 4-methylphthalic anhydride, 4-ethylphthalic anhydride, 4-methoxyphthalic anhydride, 4-chlorophthalic anhydride, 4-bromophtlhalic anhydride, pyromellitic acid and the like with a compound represented by the above mentioned formula (5).

The bisimide compounds represented by the above formula (4b), i.e. maleimide compounds, can be produced by reacting a maleic anhydride derivative such as maleic anhydride, methylmaleic anhydride, ethylmaleic anhydride, 2,3-dimethylmaleic anhydride, chloromaleic anhydride, bromomaleic anhydride, 2,3-dichloromaleic anhydride and the like with a compound represented by the above mentioned formula (5).

In greater detail, the bisimide compounds of the abovementioned formula (4a) can be produced by the following processes; for example, a process for directly producing the bisimide compound by reacting a diamine represented by the formula (5) with 2 times by mol of a phthalic dianhydride or derivative thereof in an organic solvent in the presence, if necessary, of a catalyst (20% by weight or less based on the reacting materials) such as tributylamine, triethylanine or triphenyl phosphite at above 100° C., and preferably at above 180° C.; a process which comprises reacting the phthalic anhydride with the diamine in an organic solvent at 100° C. or less and imidating the resultant bisamic acid as a bisimide precursor by heating in the presence, if necessary, of a dehydration catalyst such as p-toluenesulfonic acid etc. (1–5 times by mol of the phthalic anhydride or derivatives thereof); and a process which comprises producing bisamic acid as described above and then chemically ring-closing it with adding a dehydration ring-closure agent, for example, acid anhydrides such as acetic anhydride, propionic anhydride, benzoic anhydride, etc. or carbodiimide compounds such as dicyclohexylcarbodiimide, etc. together with, if necessary a ring-closure catalyst such as pyridine, isoquinoline, imidazole, triethylamine, etc. (which are used each in an amount of 2–10 times by mol based on phthalic anhydride or derivative thereof) at a comparatively low temperature (the room temperature—approximately 100° C.). In any case of producing by ring-closure of the bisamic acid, the reaction solution after conclusion of the ringclosure may be poured into 10 times by volume of methanol to precipitate the product, followed by washing with methanol and drying to obtain the bisimide compound.

In case of using as raw materials phthalic anhydride or phthalic anhydride derivative and diisocyanates, the bisimide compounds are possible to obtain according to the process for directly producing it as described above. In this process, the reaction is preferred to be carried out at above the room temperature, and particularly, above 60° C.

The bisimide compounds represented by the above mentioned formula (4b), that is bismaleimide compounds, can be produced by the following processes; for example, a process which comprises reacting a diamine of the formula (5) with 2 times by mol or more of maleic anhydride or maleic anhydride derivative in an orgainc solvent at 100° C. to produce bismaleamic acid as the bismaleimide precursor, and imidating it by heating to approximately 150° C. with adding, if necessary, a dehydration catalyst such as p-toluenesulfonic acid, etc. (1–5 times by mol of maleic anhydride or maleic anhydride derivative), and a process which comprises producing bismaleamic acid as described above and chemically ring-closing it with adding a dehydration ring-closure agent, for example, acid anhydrides such as acetic anhydride, propionic anhydride, benzoic anhydride, etc. or carbodiimide compounds such as dicyclohexylcarbodiimide, etc. together with, if necessary a ring-closure catalyst such as pyridine, isoquinoline, imidazole, triethylamine, etc. (which are used each in an amount of 2–10 times by mol based on phthalic anhydride or derivative thereof) at a comparatively low temperature (the room temperature—approximately 100° C.). The imidation reaction of the above both processes is preferred to carry out at a temperature as low as 150° C. or less, because the doubled bond of the maleimide group is rich in reactivity. In any case of producing by ring-closure of the polyamic acid, the reaction solution after conclusion of the ringclosure may be poured into about 10 times by volume of methanol to precipitate the product, followed by washing with methanol and drying to obtain the bismaleimide compound.

Examples of the organic solvents used for synthesizing the above described bisimide compounds include aprotic polar solvents such as N-methyl-2-pyrrolidone, N,N-dimethyl-acetamide, N,N-dimethylformamide, dimethylsulfoxide, sulforane, hexamethylphosphoric acid triamide, and 1,3-dimethyl-2-imidazolidone, and phenol solvents such as phenol, cresol, xylenol and p-chlorophenol, etc. Optionally, solvents such as benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichlene, nitrobenzene, etc. can be mixed with the above-mentioned organic solvent as a mixture.

In present invention, though the above mentioned polyimides are used alone in the adhesive layers A and B which are laminated on the metal substrate in order, two or more species selected from the above described polyimides may be suitably mixed for the purpose of controlling the glass transition temperature (Tg).

In the adhesive tapes of the present invention, it is preferred that the glass transition temperature of the adhesive layer A is higher than that of the adhesive layer B, and the glass transition temperature of the adhesive layer B is higher than that of the adhesive layer C. It is more preferred that Tg of the adhesive layer A is at least 40° C. higher than that of the adhesive layer B in viewpoint of adhesion time, adhesion pressure and temperature for producing the electronic arts. The second adhesive tape of the present invention has more excellent processability, because the adhesive layer C which is capable of temporarily bonding at a low temperature is provided on the adhesive layer B.

In the present invention, the adhesive layer B may contain at least a bisimide compound represented by the above mentioned formula (4a) or (4b). In general, adhesion of the adhesive tape is carried out at a temperature of at least 50° C. higher than the glass transition temperature of the resin composing the adhesive layer B. Furthermore, the adhesion is carried out at a temperature of at least 100° C. higher than the glass transition temperature of the resin in order to shorten the adhesion time under pressure. Accordingly, when a bisimide compound having a melting point lower than Tg+40° C. of the polyimide composing the adhesive layer B is added to the adhesive layer B, the adhesion temperature of the adhesive tape can be reduced to the melting point of the bisimide compound.

On the other hand, the adhesive tape in which the adhesive layer B comprises a bisimide compound having a higher melting point than Tg+40° C. of the polyimide, the temperature capable of adhesion under pressure is not influenced by the bisimide compound, because it depends on the glass transition temperature of the polyimide, and the adhesion strength does not deteriorate even if exposed to an atmosphere of having a temperature higher than the adhesion temperature. Therefore, it becomes possible to utilize low Tg resins (100–200° C.) which are usually difficult to use.

The adhesive layers A and B of the first adhesive tape and the adhesive layers A, B and C of the second adhesive tape according to the present invention have nearly the same thermal expansion coefficient one another, because they are composed of nearly the same species of polyimides. Accordingly, the adhesive tapes of the present invention cause less distortion in a range of from room temperature to an elevated temperature for heating and, consequently, they are excellent in processing ability.

In the adhesive layers A and B composing the adhesive tapes of the present invention, a filler having a particle size of not more than 1 $\mu$m may be incorporated for the purpose of controlling characteristics during the adhering. The content of the filler when being incorporated is preferably from 0.1 to 50% by weight, and more preferably from 0.4 to 25% by weight, based on the total solid content. If the content of the filler exceeds 50% by weight, the adhesion strength is remarkably lowered. Conversely, if it is less than 0.1% by weight, no effect of the addition of the filler can be obtained. Examples of the fillers which can be used are silica, quarts powder, mica, alumna, diamond powder, zircon powder, calcium carbonate, magnesium oxide, fluorine containing resin, and the like.

The adhesive tapes for electronic parts of the present invention may be produced by laminating resin layers containing the above mentioned polyimides on a metal substrate. The lamination can be carried out by various methods. For example, the first adhesive tape can be produced by a method which comprises applying a solution of polyimide having a higher Tg on a metal substrate and dried to form the adhesive layer A, followed by applying a solution of polyimide having a lower Tg on the resultant adhesive layer A and dried to form the adhesive layer B. The second adhesive tape can be produced by forming the adhesive layer C on the above mentioned adhesive layer B formed on the adhesive layer A by applying a solution of polyimide having a Tg lower than that of the adhesive layer B. Other examples include (1) a method which comprises bonding under pressure with heat a polyimide film previously formed corresponding to the adhesive layer B to a laminate previously prepared by laminating the adhesive layer A on a metal substrate, (2) a method which comprises producing two or three polyimide films having each a different Tg by applying solutions of polyimide having each a different Tg on a surface of a plurality of releasing films, and then laminating in order of high Tg the resultant polyimide films on a metal substrate by bonding under pressure with heat, (3) a method which comprises previously forming two or three kinds of polyimide films having each a different Tg and bonding them under pressure with heat, and bonding the resultant laminated polyimide film to a metal substrate under pressure with heat such a manner that the highest Tg side of the laminated polyimide film adheres to the metal substrate, (4) a method which comprises applying a solution of polyimide to a previously formed polyimide film and drying to produce a laminated polyimide film in which 2 or 3 adhesive layers having each a different Tg are laminated, and then bonding the laminated polyimide film to a metal substrate under pressure with heat such a manner that the highest Tg side of the laminated polyimide film adheres to the metal substrate, and (5) a method which comprises producing a polyimide film having 2 or 3 adhesive layer having each a different Tg by applying simultaneously two or three solutions of polyimides having each a different Tg to a releasing film and bonding the resultant laminated polyimide film to a metal substrate under pressure with heat such a manner that the highest Tg side of the laminated polyimide film adheres to the metal substrate.

In the present invention, it is also possible to form laminates of the adhesive layers A, B and C on both sides of the metal substrate or to form an additional adhesive layer on the laminate of the adhesive layers A, B and C by the above described methods.

In the adhesive tape for electronic parts of the present invention, the whole thickness which can be suitably varied is generally in a range of 10–250 $\mu$m. The thickness of the adhesive layer C which is the uppermost layer is generally 1–20 $\mu$m and preferably 2–10 $\mu$m, because such a thickness is sufficient to temporarily adhere the adhesive tape under pressure at a low temperature.

In order to form the adhesive layer by application, a polyimide coating varnish obtained by dissolving the above described polyimides or bisimide compounds in a suitable solvent is used as the coating solution. Examples of the organic solvents used for dissolving the polyimide and bisimide compound include various organic solvents such as aprotic polar solvents, e.g., N-methyl-2-pyrrolidone, N,N-dimethyl-acetamide, N,N-dimethylformamide, dimethylsulfoxide, sulforane, hexamethylphosphoric acid triamide, and 1,3-dimethyl-2-imidazolidone, phenol solvents such as phenol, cresol, xylenol and p-chlorophenol, etc., isophorone, cyclohexanone, carbitol acetate, diglyme, dioxane, tetrahydrofuran, etc. Moreover, alcoholic solvents such as methanol, ethanol and isopropanol, ester solvents such as methyl acetate, ethyl acetate and butyl acetate, nitrile solvents such as acetonitrile and benzonitrile, aromatic solvents such as benzene, toluene and xylene, halogen solvents such as chloroform and dichloromethane, and the like can be mixed and used in such a degree that the polyimide is not separated.

It is preferred to suitably control concentration and viscosity of the polyimide coating varnish according to the applications.

In the present invention, it is possible to provide a releasing film having thickness of 1–200 $\mu$m as a protective film on the adhesive layer B in the first adhesive tape and on the adhesive layer C in the second adhesive tape. Typical examples of the releasing film used include resin films made of polyethylene, polypropylene, fluorine containing resin, polyethylene terephthalate, polyimide, etc. and paper, and those the surface of which is subjected to releasing treatment with a silicone releasing agent.

As be clear from the results of examination shown hereafter, the adhesive tapes for electronic parts of the present invention have excellent heat resistance and adhesive strength, and thus they can be suitably used as an adhesive tape for the innerlead fix of the leadframe and a TAB tape, etc. and can be used for adhering between parts around leadframes making up a semiconductor device, for example, lead pins, semiconductor-mounted substrate, heat spreader, and semiconductor chips themselves. Moreover, when semiconductor packages are produced using the adhesive tapes of the present invention, high electrical reliability is obtained under circumference of high temperature, high humidity and high pressure without causing embedding of lead pins in the adhesive layer, movement of lead pins or interfacial separation between the adhesive layers themselves or between the adhesive layer and the metal substrate.

EXAMPLE

The present invention will now be described in greater detail. First, examples for producing polyimides and coating varnish used in the adhesive layer A are illustrated.

Synthetic Example 1

Into a flask equipped with a stirrer were introduced 31.04 g (100 mmol) of 4,4'-diamino-3,3',5,5'-tetraethyldiphenylmethane, 8.96 g (25 mmol) of 3,3',4,4'-diphenyl-sulfonetetracarboxylic dianhydride, 16.36 g (75 mmol) of pyromellitic anhydride and 300 ml of N-methyl-2-pyrrolidone at an iced temperature, and the mixture was stirred for 1 hour. Subsequently, the resultant solution was reacted at room temperature for 2 hours to synthesize a polyamic acid. To the resulting polyamic acid were added 50 ml of toluene and 1.0 g of p-toluenesulfonic acid, the mixture was heated to 160° C., and an imidation reaction was carried out for 3 hours while separating water which was flowed by being azeotropically distilled with toluene. After toluene was distilled off, the resulting polyimide varnish was poured in methanol, followed by separation of the resulting precipitate, pulverization, washing, and drying to obtain 50.0 g (yield: 95%) of a polyimide composed of the above mentioned repeating units in a proportion of (1a):(1b)=25:75.

The IR spectrum measurement of the resultant polyimide showed typical absorption bands of imide at 1718 cm$^{-1}$ and 1783 cm$^{-1}$. The number average molecular weight, glass transition temperature (Tg) and temperature of initiating thermal decomposition of the polyimide were determined. The results are shown in Table 1.

The resultant polyimide was dissolved in N,N-dimethylformamide so as to be the concentration of 25% by weight to produce a coating varnish.

Synthetic Example 2

Using 31.04 g (100 mmol) of 4,4'-diamino-3,3',5,5'-tetraethyldiphenyl methane, 17.92 g (50 mmol) of 3,3',4,4'-diphenylsulfonetetracarboxylic dianhydride, 10.91 g(50 mmol) of pyromellitic anhydride and 300 ml of N-methyl-2-pyrrolidone, a polyimide composed of the repeating units in a proportion of (1a):(1b)=50:50 was obtained in an amount of 53.5 g (yield: 95%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in N,N-dimethylformamide so as to be the concentration of 25% by weight to produce a coating varnish.

Synthetic Example 3

Using 31.04 g (100 mmol) of 4,4'-diamino-3,3',5,5'-tetraethyldiphenyl methane, 26.88 g (75 mmol) of 3,3',4,4'-diphenylsulfonetetracarboxylic dianhydride, 5.46 g (25 mmol) of pyromellitic anhydride and 300 ml of N-methyl-2-pyrrolidone, a polyimide composed of the repeating units in a proportion of (1a):(1b)=75:25 was obtained in an amount of 57.4 g (yield: 97%) by the same manner as in Synthetic Example 1.

The IR spectrum measurement of the resultant polyimide showed typical absorption bands of imide at 1718 cm$^{-1}$ and 1783 cm$^-$. The number average molecular weight, glass transition temperature and temperature of initiating thermal decomposition of the resultant polyimide were determined. The results are shown in Table 1.

The resultant polyimide was dissolved in N,N-dimethylformamide so as to be the concentration of 25% by weight to produce a coating varnish.

Synthetic Example 4

Using 25.45 g (100 mmol) of 4,4'-diamino-3,3',5,5'-tetramethyldiphenyl methane, 17.92 g (50 mmol) of 3,3',4,4'-diphenylsulfonetetracarboxylic dianhydride, 10.91 g(50 mmol) of pyromellitic anhydride and 300 ml of N-methyl-2-pyrrolidone, a polyimide composed of the repeating units in a proportion of (1a):(1b)=50:50 was obtained in an amount of 52.1 g (yield: 96%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in N,N-dimethylformamide so as to be the concentration of 25% by weight to produce a coating varnish.

Synthetic Example 5

Using 41.05 g (100 mmol) of 2,2-bis[4-(4-aminophenoxy)phenyl]propane, 17.92 g (50 mmol) of 3,3',4,4'-diphenylsulfonetetracarboxylic dianhydride, 10.91 g(50 mmol) of pyromellitic anhydride and 300 ml of N-methyl-2-pyrrolidone, a polyimide composed of the repeating units in a proportion of (1a):(1b)=50:50 was obtained in an amount of 63.0 g (yield: 95%) by the same manner as in Synthetic Example 1.

The IR spectrum measurement of the resultant polyimide showed typical absorption bands of imide at 1718 cm$^{-1}$ and 1783 cm$^{-1}$ . The number average molecular weight, glass transition temperature and temperature of initiating thermal decomposition of the resultant polyimide were determined. The results are shown in Table 1.

The resultant polyimide was dissolved in N,N-dimethylformamide so as to be the concentration of 25% by weight to produce a coating varnish.

Synthetic Example 6

Using 42.77 g (100 mmol) of bis[4-(4-aminophenoxy)-phenyl]sulfone, 17.92 g (50 mmol) of 3,3',4,4'-diphenyl-sulfonetetracarboxylic dianhydride, 10.91 g (50 mmol) of pyromellitic anhydride and 300 ml of N-methyl-2-pyrrolidone, a polyimide composed of the repeating units in a proportion of (1a):(1b)=50:50 was obtained in an amount of 67.3 g (yield: 94%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in N,N-dimethylformamide so as to be the concentration of 25% by weight to produce a coating varnish.

Synthetic Example 7

Using 36.84 g (100 mmol) of 4,4'-bis(4-aminophenoxy) biphenyl, 17.92 g (50 mmol) of 3,3',4,4'-diphenyl-sulfonetetracarboxylic dianhydride, 10.91 g (50 mmol) of pyromellitic anhydride and 300 ml of N-methyl-2-pyrrolidone, a polyimide composed of the repeating units in a proportion of (1a):(1b)=50:50 was obtained in an amount of 59.6 g (yield: 96%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in. N,N-dimethylformamide so as to be the concentration of 25% by weight to produce a coating varnish.

Synthetic Example 8

Using 29.23 g (100 mmol) of 1,3-bis(4-aminophenoxy)-benzene, 17.92 g (50 mmol) of 3,3',4,4'-diphenylsulfone-tetracarboxylic dianhydride, 10.91 g (50 mmol) of pyromellitic anhydride and 300 ml of N-methyl-2-pyrrolidone, a polyimide composed of the repeating units in a proportion of (1a):(1b)=50:50 was obtained in an amount of 52.8 g (yield:97%) by the same manner as in Synthetic Example 1.

The IR spectrum measurement of the resultant polyimide showed typical absorption bands of imide at 1718 cm$^{-1}$ and 1783 cm$^{-1}$ The number average molecular weight, glass transition temperature and temperature of initiating thermal decomposition of the resultant polyimide were determined. The results are shown in Table 1.

The resultant polyimide was dissolved in N,N-dimethylformamide so as to be the concentration of 25% by weight to produce a coating varnish.

Synthetic Example 9

Using 29.23 g (100 mmol) of 1,4-bis(4-aminophenoxy)-benzene, 17.92 g (50 mmol) of 3,3',4,4'-diphenylsulfone-tetracarboxylic dianhydride, 10.91 g (50 mmol) of pyromellitic anhydride and 300 ml of N-methyl-2-pyrrolidone, a polyimide composed of the repeating units in a proportion of (1a):(1b)=50:50 was obtained in an amount of 52.3 g (yield: 96%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in N,N-dimethylformamide so as to be the concentration of 25% by weight to produce a coating varnish.

In the following, examples for producing polyimides and coating varnish used in the adhesive layer B are illustrated.

Synthetic Example 10

Using 19.58 g (67 mmol) of 1,4-bis(4-aminophenoxy)-benzene, 8.20 g (33 mmol) of 1,3-bis(3-aminopropyl)-1,1,3,3-tetramethyldisiloxane, 35.83 g (100 mmol) of 3,3,4,4'-diphenylsulfonetetracarboxylic dianhydride and 300 ml of N-methyl-2-pyrrolidone, a polyimide composed of the repeating units in a proportion of (1a):(2)=67:33 was obtained in an amount of 58.0 g (yield: 97%) by the sable manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 11

Using 19.58 g (67 mmol) of 1,3-bis(4-aminophenoxy)-benzene, 8.20 g (33 imol) of 1,3-bis(3-aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)=67:33 was obtained in an amount of 58.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 12

Using 23.08 g (67 mmol) of 1,3-bis[1-(4-aminophenyl)-1-methylethyl]benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)=67:33 was obtained in an amount of 62.5 g (yield: 98%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 13

Using 24.68 g (67 mmol) of 4,4'-bis(4-aminophenoxy)-biphenyl, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)=67:33 obtained in an amount of 64.0 g (yield: 98%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 14

Using 25.75 g (67 mmol) of 4,4'-bis(4-aminophelnoxy)-diphenyl ether, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)=67:33 was obtained in an amount of 64.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 15

Using 28.98 g (67 mmol) of bis-[4-(4-aminophenoxy)-phenyl]sulfone, 8.20 g (33 mmol) of 1,3-bis(3-aminopropyl)-1,1,3,3-tetramethyldisiloxane, 35.83 g (100 mmol) of 3,3', 4,4'-diphenylsulfonetetracarboxylic dianhydride and 300 ml of N-methyl-2-pyrrolidone, a polyimide composed of the repeating units in a proportion of (1a):(2)=67:33 was obtained in an amount of 65.0 g (yield: 94%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 16

Using 27.50 g (67 mmol) of 2,2-bis-[4-(4-aminophenoxy)phenyl]propane, 8.20 g (33 mmol) of 1,3-bis(3-aminopropyl)-1,1,3,3-tetramethyldisiloxane, 35.83 g (100 mmol) of 3,3',4,4,'-diphenylsulfonetetracarboxylic dianhydride and 300 ml of N-methyl-2-pyrrolidone, a polyimide composed of the repeating units in a proportion of (1a):(2)=67:33 was obtained in an amount of 65.0 g (yield: 96%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 17

Using 34.74 g (67 mmol) of 2,2-bis-[4-(4-aminophenoxy)phenyl]hexafluoropropane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)=67:33 was obtained in an amount of 74.0 g (yield: 98%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 18

Using 23.35 g (67 mmol) of 9,9-bis(4-aminophenyl)-fluorene, 8.20 g (33 mmol) of 1,3-bis(3-aminopropyl)-1 1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)=67:33 was obtained in an amount of 60.5 g (yield: 95%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 19

Using 20.53 g (50 mmol) of 2,2-bis-[4-(4-aminophenoxy)phenyl]propane, 12.43 g (50 mmol) of 1,3-bis(3-aminopropyl)-1,1,3,3-tetramethyldisiloxane, 35.83 g (100 mmol) of 3,3',4,4 '-diphenylsulfonetetracarboxylic dianhydride and 300 ml of N-methyl-2-pyrrolidone, a polyimide composed of the repeating units in a proportion of (1a):(2)=50:50 was obtained in an amount of 61.0 g (yield: 93%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 20

Using 30.79 g (75 mmol) of 2,2-bis-[4-(4-aminophenoxy)phenyl]propane, 6.21 g (25 mmol) of 1,3-bis(3- aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)= 75:25 was obtained in an amount of 65.0 g (yield: 94%) by the same manner as in Synthetic Example 1.

The IR spectrum measurement of the resultant polylmide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 21

Using 32.84 g (80 mmol) of 2,2-bis-[4-(4-aminophenoxy)phenyl]propane, 4.97 g (20 mmol) of 1,3-bis(3-aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)= 80:20 was obtained in an amount of 68.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 22

Using 36.95 g (90 mmol) of 2,2-bis-[4-(4-aminophenoxy)phenyl]propane, 2.49 g (10 'mol) of 1,3-bis(3-aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)=90:10 was obtained in an amount of 68.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 23

Using 30.79 g (75 mmol) of 2,2-bis-[4-(4-aminophenoxy)phenyl]propane, 9.42 g (25 imol) of 1,3-bis[(3-aminophenoxy)methyl]-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)=75:25 was obtained in an amount of 69.0 g (yield:')5%) by the same manner as in Synthetic Example 1.

The IR spectrum measurement of the resultant polyimide showed typical absorption bands of imide at 1720 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 24

Using 30.79 g (75 mmol) of 2,2-bis[4-(4-aminophenoxy)phenyl]propane, 10.72 g (25 mmol) of aminopropyl terminated dimethylsiloxane tetramer represented by the above described formula (6) wherein Y=NH$_2$, R=propylene and n=3, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)=75:25 was obtained in an amount of 67.0 g (yield: 91%) by the same manner as in Synthetic Example 1.

The IR spectrum measurement of the resultant polyimide showed typical absorption bands of imide at 1712 cm$^{-1}$ and 1783 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 25

Using 31.04 g (100 mmol) of 4,4'-diamino-3,3',5,5'-tetraethyldiphenylmethane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2)=100:0 was obtained in an amount of 58.8 g (yield: 93%) by the same manner as in

Synthetic Example 1.

The IR spectrum measurement of the resultant polyimide showed typical absorption bands of imide at 1720 cm$^{-1}$ and 1780 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 26

Using 7.76 g (25 imol) of 4,4'-diamino-3,3', 5,5'-tetraethyldiphenyl methane, 6.21 g (25 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, a polyimide composed of the repeating units in a proportion of (1a):(2)= 50:50 was obtained in an amount of 27.4 g (yield: 91%) by the same manner as in Synthetic Example 1.

The IR spectrum measurement of the resultant polyimide showed typical absorption bands of imide at 1720 cm$^{-1}$ and 1780 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Synthetic Example 27

Using 11.64 g (37.5 mmol) of 4,4'-diamino-3,3',5,5'-tetraethyldiphenyl methane, 3.11 g (12.5 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, a polyimide composed of the repeating units in a proportion of (1a):(2)=75:25 was obtained in an amount of 29.6 g (yield:. 92%) by the same manner as in Synthetic Example 1.

The IR spectrum measurement of the resultant polyimide showed typical absorption bands of imide at 1720 cm$^{-1}$ and 1780 cm$^{-1}$. The number average molecular weight, glass transition temperature and temperature of initiating thermal decomposition of the polyimide were determined. The results are shown in Table 2.

The resultant polyimide was dissolved in tetrahydrofuran so as to be the concentration of 25% by weight to produce a coating varnish.

Examples for producing polyimides and coating varnish used in the adhesive layer C are then illustrated in the following.

Synthetic Example 28

Using 29.42 g (72 mmol) of 2,2-bis[4-(4-aminophenoxy)phenyl]propane, 21.75 g (28 mmol) of dimethylsiloxane polymer represented by the above described formula (6) wherein Y=NH$_2$, R=propylene and n=8, 35.83 g (100 mmol) of 3,3',4,4'-diphenylsulfonetetracarboxylic dianhydride and 300 ml of N-methyl-2-pyrrolidone, a polyimide composed of the repeating units in a proportion of (3a):(3b)=72:28 was obtained in an amount of 78.4 g (yield: 94%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 3.

The resultant polyimide was dissolved in tetrahydrofuran so as to be the concentration of 25% by weight to produce a coating varnish.

Synthetic Example 29

Using 30.39 g (74 mmol) of 2,2-bis[4-(4-aminophenoxy)phenyl]propane, 19.94 g (26 mmol) of dimethylsiloxane polymer represented by the above described formula (6) wherein Y=NH$_2$, R=propylene and n=8, 29.42 g (100 mmol) of 3,3',4,4'-biphenyltetracarboxylic dianhydride and 300 ml of N-methyl-2-pyrrolidone, a polyimide composed of the repeating units in a proportion of (3a):(3b)=74:26 was obtained in an amount of 72.3 g (yield: 95%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 3.

The resultant polyimide was dissolved in tetrahydrofuran so as to be the concentration of 25% by weight to produce a coating varnish.

Synthetic Example 30

Using 32.74 g (80 mmol) of 2,2-bis[4-(4-aminophenoxy)phenyl]propane, 15.54 g (20 mmol) of dimethylsiloxane polymer represented by the above described formula (6) wherein Y=NH$_2$, R=propylene and n=8, 29.42 g (100 mmol) of 2,3', 3,4'-biphenyltetracarboxylic dianhydride and 300 ml of N-methyl-2-pyrrolidone, a polyimide composed of the repeating units in a proportion of (3a):(3b)=80:20 was obtained in an amount of 69.7 g (yield: 94%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 3.

The resultant polyimide was dissolved in tetrahydrofuran so as to be the concentration of 25% by weight to produce a coating varnish.

Synthetic Example 31

Using 23.24 g (80 mmol) of 1,3-bis(3-aminophenoxy)benzene, 15.54 g (20 mmol) of dimethylsiloxane polymer represented by the above described formula (6) wherein Y=NH$_2$, R=propylene and n=8, 29.42 g (100 mmol) of 2,3',3,4'-biphenyltetracarboxylic dianhydride and 300 ml of N-methyl-2-pyrrolidone, a polyimide composed of the repeating units in a proportion of (3a):(3b)=80:20 was obtained in an amount of 60.1 g (yield: 93%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 3.

The resultant polyimide was dissolved in tetrahydrofuran so as to be the concentration of 25% by weight to produce a coating varnish.

Synthetic Example 32

Using 27.14 g (76 mmol) of 1,3-bis[1-(3-aminophenyl)-1-methylethyl]benzene, 18.52 g (24 mmol) of dimethylsiloxane polymer represented by the above described formula (6) wherein Y=NH$_2$, R=propylene and n=8, 29.42 g (100 mmol) of 2,3',3,4'-biphenyltetracarboxylic dianhydride and 300 ml of N-methyl-2-pyrrolidone, a polyimide composed of the repeating units in a proportion of (3a):(3b)=76:24 was obtained in an amount of 60.1 g (yield: 93%) by the same manner as in Synthetic Example 1.

The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 3.

The resultant polyimide was dissolved in tetrahydrofuran so as to be the concentration of 25% by weight to produce a coating varnish.

TABLE 1

| Synthetic Example | (1a):(1b) | Number average molecular weight (×10⁴) | Glass transition temperature (° C.) | Temperature of initiating thermal decomposition (° C.) |
|---|---|---|---|---|
| 1 | 25:75 | 1.9 | 400 | 465 |
| 2 | 50:50 | 1.9 | 350 | 455 |
| 3 | 75:25 | 1.7 | 330 | 450 |
| 4 | 50:50 | 2.1 | 380 | 455 |
| 5 | 50:50 | 2.2 | 370 | 460 |
| 6 | 50:50 | 2.3 | 380 | 455 |
| 7 | 50:50 | 1.8 | 390 | 465 |
| 8 | 50:50 | 1.9 | 380 | 460 |
| 9 | 50:50 | 1.9 | 350 | 460 |

TABLE 2

| Synthetic Example | (1a):(2) | Number average molecular weight (×10⁴) | Glass transition temperature (° C.) | Temperature of initiating thermal decomposition (° C.) |
|---|---|---|---|---|
| 10 | 67:33 | 3.9 | 230 | 450 |
| 11 | 67:33 | 2.5 | 192 | 450 |
| 12 | 67:33 | 3.8 | 160 | 450 |
| 13 | 67:33 | 5.3 | 232 | 450 |
| 14 | 67:33 | 2.5 | 230 | 453 |
| 15 | 67:33 | 1.2 | 170 | 450 |
| 16 | 67:33 | 2.6 | 211 | 458 |
| 17 | 67:33 | 2.3 | 201 | 451 |
| 18 | 67:33 | 3.6 | 241 | 452 |
| 19 | 50:50 | 2.3 | 180 | 451 |
| 20 | 75:25 | 4.5 | 226 | 465 |
| 21 | 80:20 | 4.6 | 236 | 464 |
| 22 | 90:10 | 4.8 | 248 | 460 |
| 23 | 75:25 | 4.4 | 230 | 455 |
| 24 | 75:25 | 4.3 | 180 | 440 |
| 25 | 100:0 | 4.9 | 282 | 446 |
| 26 | 50:50 | 2.6 | 186 | 458 |
| 27 | 75:25 | 6.9 | 224 | 421 |

TABLE 3

| Synthetic Example | (3a):(3b) | Number average molecular weight (×10⁴) | Glass transition temperature (° C.) | Temperature of initiating thermal decomposition (° C.) |
|---|---|---|---|---|
| 28 | 72:28 | 1.8 | 30 | 410 |
| 29 | 74:26 | 1.9 | 45 | 410 |
| 30 | 80:20 | 2.7 | 45 | 410 |
| 31 | 80:20 | 2.3 | 40 | 410 |
| 32 | 76:24 | 2.1 | 20 | 410 |

In the above Tables 1–3, the measurement (of the molecular weight of polyimides was carried out by GPC using tetrahydrofuran as an eluent and Shodex 80M×2 as a column. Value of the molecular weight is a number average molecular weight which is calculated as polystyrene. The glass transition temperature was determined by differential thermal analysis (in a nitrogen atmosphere, heated at 10° C./min.) and the temperature of initiating thermal decomposition was determined by thermogravimetry (in a nitrogen atmosphere, heated at 10° C./min.)

In the following, examples for producing bisimide compounds used in the adhesive layer B are illustrated.

Synthetic Example 33

Into a flask equipped with a stirrer were introduced 36.8 g (100 mmol) of 4,4'-bis(3-aminophenoxy)biphenyl, 31.1 g (210 mmol) of phthalic anhydride and 300 ml of N-methyl-2-pyrrolidone at an iced temperature, and the mixture was stirred for 1 hour. Subsequently, the resultant solution was reacted at room temperature for 2 hours to synthesize an amic acid. Then, 40.4 g (400 mmol) of triethylamine and 30.6 g (300 mmol) of acetic acid anhydride were added slowly to the resulting bisamic acid, followed by stirring at the room temperature for 2 hours. The resultant solution was poured into methanol, followed by filtration to obtain a precipitate. The resultant precipitate was washed with methanol, dried at 150° C. for 2 hours to produce 47.5 g (yield based on diamine: 76%) of a bisimide compound represented by the above mentioned formula (4a).

The IR spectrum measurement of the resultant bisimide compound showed typical absorption bands of imide at 1720 cm$^{-1}$ and 1780 cm$^{-1}$ and a band of ether at 1240 cm$^{-1}$. The melting point and the elementary analysis of it were determined. The results are shown in Table 4.

Synthetic Example 34

Using 41.1 g (100 mmol) of 2,2-bis[4-(3-aminophenoxy)phenyl]propane, 31.1 g (210 mmol) of phthalic anhydride and 500 ml of N-methyl-2-pyrrolidone, a bisimide compound represented by the above-mentioned formula (4a) was obtained in an amount of 53.5 g (yield based on diamine: 80%) by the same manner as in Synthetic Example 33.

The IR spectrum measurement of the resultant bisimide compound showed typical absorption bands of imide at 1720 cm$^{-1}$ and 1780 cm$^{-1}$ and a band of ether at 1240 cm$^{-1}$. The melting point and the elementary analysis of it were determined. The results are shown in Table 4.

Synthetic Example 35

Using 34.4 g (100 mmol) of 1,3-bis(4-amino-α,α-dimethylbenzyl)benzene, 31.1 g (210 mmol) of phthalic anhydride and 500 ml of N-methyl-2-pyrrolidone, a bisimide compound represented by the above-mentioned formula (4a) was obtained in an amount of 58.0 g (yield based on diamine: 96%) by the same manner as in Synthetic Example 33.

The IR spectrum measurement of the resultant bisimide compound showed typical absorption bands of imide at 1720 cm$^{-1}$ and 1780 cm$^{-1}$. The melting point and the elementary analysis of it were determined. The results are shown in Table 4.

Synthetic Example 36

Using 36.8 g (100 mmol) of 4,4'-bis(4-aminophenoxy)biphenyl, 31.1 g (210 mmol) of phthalic anhydride and 500 ml of N-methyl-2-pyrrolidone, a bisimide compound represented by the above-mentioned formula (4a) was obtained in an amount of 56.5 g (yield based on diamine: 90%) by the same manner as in Synthetic Example 33.

The IR spectrum measurement of the resultant bisimide compound showed typical absorption bands of imide at 1720 cm$^{-1}$ and 1780 cm$^{-1}$ and a band of ether at 1240 cm$^{-1}$. The melting point and the elementary analysis of it were determined. The results are shown in Table 4.

Synthetic Example 37

Using 41.1 g (100 mmol) of 2,2-bis[4-(4-aminophenoxy)phenyl]propane, 31.1 g (210 mmol) of phthalic anhydride and 500 ml of N-methyl-2-pyrrolidone, a bisimide compound represented by the above-mentioned formula (4a) was obtained in an amount of 62.3 g (yield based on diamine: 93%) by the same manner as in Synthetic Example 33.

The IR spectrum measurement of the resultant bisimide compound showed typical absorption bands of imide at 1720 cm$^{-1}$ and 1780 cm$^{-1}$ and a band of ether at 1240 cm$^{-1}$. The melting point and the elementary analysis of it were determined. The results are shown in Table 4.

Synthetic Example 38

Using 31.0 g (100 mmol) of 4,4'-diamino-3,3',5,5'-tetraethyldiphenylmethane, 31.1 g (210 mmol) of phthalic anhydride and 500 ml of N-methyl-2-pyrrolidone, a bisimide compound represented by the above-mentioned formula (4a) was obtained in an amount of 47.4 g (yield based on diamine: 83%) by the same manner as in Synthetic Example 33.

The IR spectrum measurement of the resultant bisimide compound showed typical absorption bands of imide at 1720 cm$^{-1}$ and 1780 cm$^{-1}$. The melting point and the elementary analysis of it were determined. The results are shown in Table 4.

Synthetic Example 39

Using 43.2 g (100 mmol) of bis[4-(3-aminophenoxy)phenyl]sulfone, 31.1 g (210 mmol) of phthalic anhydride and 500 ml of N-methyl-2-pyrrolidone, a bisimide compound represented by the above-mentioned formula (4a) was obtained in an amount of 59.6 g (yield based on diamine: 86%) by the same manner as in Synthetic Example 33.

The IR spectrum measurement of the resultant bisimide compound showed typical absorption bands of imide at 1720 cm$^{-1}$ and 1780 cm$^{-1}$ and a band of ether at 1240 cm$^{-1}$. The melting point and the elementary analysis of it were determined. The results are shown in Table 4.

Synthetic Example 40

Using 41.1 g (100 mmol) of 2,2-bis[4-(4-aminophenoxy)phenyl]propane, 40.5 g (210 mmol) of trimellitic anhydride and 500 ml of N-methyl-2-pyrrolidone, a bisimide compound represented by the above-mentioned formula (4a) was obtained in an amount of 67.7 g (yield based on diamine: 89%) by the same manner as in Synthetic Example 33.

The IR spectrum measurement of the resultant bisimide compound showed typical absorption bands of imide at 1720 cm$^{-1}$ and 1780 cm$^{-1}$ and a band of ether at 1240 cm$^{-1}$. The melting point and the elementary analysis of it were determined. The results are shown in Table 4.

Synthetic Example 41

Using 41.1 g (100 mmol) of 2,2-bis[4-(4-aminophenoxy)phenyl]propane, 20.6 g (210 mmol) of maleic anhydride and 500 ml of N-methyl-2-pyrrolidone, a bisimide compound represented by the above-mentioned formula (4b) was obtained in an amount of 48.5 g (yield based on diamine: 85%) by the same manner as in Synthetic Example 33.

The IR spectrum measurement of the resultant bisimide compound showed typical absorption bands of imide at 1720 cm$^{-1}$ and 1780 cm$^{-1}$ and a band of the double bond in maleimide at 690 cm$^{-1}$. The melting point and the elementary analysis of it were determined. The results are shown in Table 4.

Synthetic Example 42

Using 31.0 g (100 mmol) of 4,4'-diamino-3,3',5,5'-tetraethyldiphenylmethane, 20.6 g (210 mmol) of maleic anhydride and 500 ml of N-methyl-2-pyrrolidone, a bisimide compound represented by the above-mentioned formula (4b) was obtained in an amount of 38.1 g (yield based on diamine: 81%) by the same manner as in Synthetic Example 33.

The IR spectrum measurement of the resultant bisimide compound showed typical absorption bands of imide at 1720 cm$^{-1}$ and 1780 cm$^{-1}$ and a band of the double bond in maleimide at 690 cm$^{-1}$. The melting point and the elementary analysis of it were determined. The results are shown in Table 4.

In Table 4, the melting point of each bisimide compound means an endothermic peak value measured by differential scanning calorimetry with heating at 3° C./minute.

TABLE 4

| Synthetic Example | Melting point (° C.) | Elementary analysis (C:H:N:S) | |
|---|---|---|---|
| | | Calculation (%) | Measurement (%) |
| 33 | 285 | 76.40:3.92:4.46:0.00 | 76.31:3.79:4.45:0.00 |
| 34 | 249 | 77.01:4.48:4.18:0.00 | 77.11:4.43:4.17:0.00 |
| 35 | 240 | 79.47:5.30:4.64:0.00 | 79.53:5.44:4.59:0.00 |
| 36 | 292 | 76.40:3.82:4.46:0.00 | 76.33:3.83:4.41:0.00 |
| 37 | 220 | 77.01:4.48:4.16:0.00 | 77.09:4.39:4.15:0.00 |
| 38 | 260 | 77.97:6.01:4.91:0.00 | 77.19:6.11:4.91:0.00 |
| 39 | 235 | 69.36:3.49:4.05:4.63 | 69.45:3.52:4.11:4.66 |
| 40 | 330 | 71.04:4.24:3.69:0.00 | 71.14:4.34:3.76:0.00 |
| 41 | 156 | 73.67:4.59:4.91:0.00 | 73.76:4.65:4.81:0.00 |
| 42 | 153 | 74.02:6.43:5.95:0.00 | 74.12:6.33:6.01:0.00 |

Comparative Synthetic Example 1

Using 16.40 g (40 mmol) of 2,2-bis[4-(4-aminophenoxy)phenyl]propane, 8.42 g (40 mmol) of trimellitic acid anhydride monochloride and 120 ml of N-methyl-2-pyrrolidone, a polyether amidoimide was obtained in an amount of 20.8 g (yield: 92%) by the same manner as in Synthetic Example 1.

The IR spectrum measurement of the resultant polyether amidoimide showed typical absorption bands of imide at 1720 cm$^{-1}$ and 1780 cm$^{-1}$ and a typical absorption band of amide at 1715 cm$^{-1}$. It has a molecular weight of 21,000, Tg of 228° C. and temperature of initiating thermal decomposition of 430° C.

The resultant polyether amidoimide was dissolved in tetrahydrofuran so as to be the concentration of 25% by weight to produce a coating varnish.

Comparative Synthetic Example 2

Using 8.01 g (40 mmol) of 4,4'-diaminodiphenyl ether, 10.80 g (40 mmol) of biphenyltetracarboxylic dianhydride and 120 ml of N-methyl-2-pyrrolidone, a polyimide was obtained in an amount of 16.1 g (yield: 93%) by the same manner as in Synthetic Example 1.

The IR spectrum measurement of the resultant polyether amidoimide showed typical absorption bands of imide at 1715 cm$^{-1}$ and 1786 cm$^{-1}$. The molecular weight of it could not be measured by the above mentioned method, because it did not dissolve in tetrahydrofuran. Tg of it was 290° C. and temperature of initiating thermal decomposition of it was 560° C. The resultant polyimide was dissolved in o-dichlorophenol so as to be the concentration of 20% by weight to produce a coating varnish.

Comparative Synthetic Example 3

20.80g (40 mmol) of 2,2-bis[4-(1,2-dicarboxyphenoxy)phenyl]propane dianhydride and 8.42 g (40 mmol) of trimellitic acid anhydride monochloride were dissolved in 120 ml of N-methyl-2-pyrrolidone. To the resulted solution was added 4.34 g (0.04 mol) of m-phenylenediamine, and the mixture was stirred at 0° C. for 4 hours to obtain a solution containing 20% by weight of polyamic acid. The resultant solution was used as the coating varnish for the below-mentioned comparative adhesive tapes. A resin obtained by polyether-imidation had Tg of 216° C. and temperature of initiating thermal decomposition of 510° C.

The IR spectrum measurement of the resultant resin showed typical absorption bands of imide at 1715 cm$^{-1}$ and 1786 cm$^{-1}$. The molecular weight of the resin could not be measured by the above mentioned method, because it did not dissolve in tetrahydrofuran.

Production of Adhesive Tapes

EXAMPLE 1

The coating varnish obtained in Synthetic Example 1 was applied to a surface of a copper plate having the thickness of 50 μm by a bar-coater so as to be a dried thickness of 20 μm, and dried in a hot air circulating oven at 150° C. for 60 minutes to form the adhesive layer A on the copper plate. Then, the coating varnish obtained in Synthetic Example 26 (Tg of the polyimide contained was different from that of the polyimide of Synthetic Example 1) was applied to the surface of the adhesive layer A formed on the copper plate so as to be a dried thickness of 20 μm, and dried in a hot air circulating oven at 150° C. for 10 minutes to form an adhesive layer B. Thus an adhesive tape having the total thickness of 90 μm according to the present invention was produced, in which the copper plate, the adhesive layer A and the adhesive layer B were laminated in order.

EXAMPLES 2–43

Adhesive tapes were produced by the same manner as in Example 1, except that polyimides and bisimide compounds obtained in the above described Synthetic Examples 1–42 were used.

Silica filler having the particle size of 0.07 μm (produced by Arakawa Chemical Industries, Ltd.) was added in an amount of 10% by weight to the adhesive layer A in Example 26 and to the adhesive layer B in Example 27. Alumina filler having the particle size of 0.05 μm (produced by Showa Denko K. K.) was added in an amount of 10% by weight to the adhesive layer B in Example 28.

The coating varnishes used in the adhesive layer B of Examples 24–43 were prepared by dispersing or dissolving the corresponding bisimide compound in the corresponding polyimide solution obtained in each Synthetic Example.

EXAMPLE 44

An adhesive tape was produced by the same manner as in Example 1, except that a 100 μm thick copper plate was used in place of the 50 μm thick copper plate.

EXAMPLE 45

An adhesive tape was produced by the same manner as in Example 1, except that a 200 μm thick copper plate was used in place of the 50 μm thick copper plate.

Coating varnishes used for producing the adhesive layers A and B in Examples 1–45, bisimide compounds, fillers and amounts thereof, and adhesion temperatures of the adhesive layer B of the formed adhesive tapes which are the optimum temperature for assembling leadframes) are shown in Table 5.

TABLE 5

| Example (Adhesive tape) | Adhesive layer A Polyimide | Filler (wt. %) | Adhesive layer B Polyimide | Filler or bisimide (wt. %) | Adhesion temperature (° C.) |
|---|---|---|---|---|---|
| 1 | Syn. Ex. 1 | 0 | Syn. Ex. 26 | 0 | 280 |
| 2 | Syn. Ex. 2 | 0 | Syn. Ex. 26 | 0 | 280 |
| 3 | Syn. Ex. 3 | 0 | Syn. Ex. 26 | 0 | 280 |
| 4 | Syn. Ex. 4 | 0 | Syn. Ex. 26 | 0 | 280 |
| 5 | Syn. Ex. 5 | 0 | Syn. Ex. 26 | 0 | 280 |
| 6 | Syn. Ex. 6 | 0 | Syn. Ex. 26 | 0 | 280 |
| 7 | Syn. Ex. 7 | 0 | Syn. Ex. 26 | 0 | 280 |
| 8 | Syn. Ex. 8 | 0 | Syn. Ex. 26 | 0 | 280 |
| 9 | Syn. Ex. 9 | 0 | Syn. Ex. 26 | 0 | 280 |
| 10 | Syn. Ex. 2 | 0 | Syn. Ex. 10 | 0 | 310 |
| 11 | Syn. Ex. 2 | 0 | Syn. Ex. 11 | 0 | 280 |
| 12 | Syn. Ex. 2 | 0 | Syn. Ex. 12 | 0 | 240 |
| 13 | Syn. Ex. 2 | 0 | Syn. Ex. 13 | 0 | 320 |
| 14 | Syn. Ex. 2 | 0 | Syn. Ex. 14 | 0 | 310 |
| 15 | Syn. Ex. 2 | 0 | Syn. Ex. 15 | 0 | 250 |
| 16 | Syn. Ex. 2 | 0 | Syn. Ex. 16 | 0 | 290 |
| 17 | Syn. Ex. 2 | 0 | Syn. Ex. 17 | 0 | 280 |
| 18 | Syn. Ex. 2 | 0 | Syn. Ex. 18 | 0 | 320 |
| 19 | Syn. Ex. 2 | 0 | Syn. Ex. 19 | 0 | 260 |
| 20 | Syn. Ex. 2 | 0 | Syn. Ex. 20 | 0 | 310 |
| 21 | Syn. Ex. 2 | 0 | Syn. Ex. 21 | 0 | 320 |
| 22 | Syn. Ex. 2 | 0 | Syn. Ex. 23 | 0 | 310 |
| 23 | Syn. Ex. 2 | 0 | Syn. Ex. 24 | 0 | 260 |
| 24 | Syn. Ex. 2 | 0 | Syn. Ex. 27 | 0 | 310 |
| 25 | Syn. Ex. 2 | 0 | Syn. Ex. 12/ Syn. Ex. 25 = 7/3 | 0 | 280 |
| 26 | Syn. Ex. 3 | Silica 10 | Syn. Ex. 26 | 0 | 280 |
| 27 | Syn. Ex. 2 | 0 | Syn. Ex. 26 | Silica 10 | 290 |
| 29 | Syn. Ex. 2 | 0 | Syn. Ex. 26 | Alumina 10 | 290 |
| 29 | Syn. Ex. 2 | 0 | Syn. Ex. 26 | Syn. Ex. 33 10 | 290 |
| 30 | Syn. Ex. 2 | 0 | Syn. Ex. 26 | Syn. Ex. 34 30 | 290 |

TABLE 5-continued

| Example (Adhesive tape) | Adhesive layer A Polyimide | Filler (wt. %) | Adhesive layer B Polyimide | Filler or bis-imide (wt. %) | Adhesion temperature (° C.) |
|---|---|---|---|---|---|
| 31 | Syn. Ex. 2 | 0 | Syn. Ex. 26 | Syn. Ex. 35 30 | 290 |
| 32 | Syn. Ex. 2 | 0 | Syn. Ex. 26 | Syn. Ex. 36 30 | 250 |
| 33 | Syn. Ex. 2 | 0 | Syn. Ex. 26 | Syn. Ex. 37 30 | 290 |
| 34 | Syn. Ex. 2 | 0 | Syn. Ex. 26 | Syn. Ex. 39 30 | 300 |
| 35 | Syn. Ex. 2 | 0 | Syn. Ex. 26 | Syn. Ex. 39 30 | 300 |
| 36 | Syn. Ex. 2 | 0 | Syn. Ex. 26 | Syn. Ex. 40 30 | 320 |
| 37 | Syn. Ex. 2 | 0 | Syn. Ex. 27 | Syn. Ex. 37 30 | 250 |
| 38 | Syn. Ex. 2 | 0 | Syn. Ex. 27 | Syn. Ex. 37 20 | 250 |
| 39 | Syn. Ex. 2 | 0 | Syn. Ex. 27 | Syn. Ex. 37 50 | 250 |
| 40 | Syn. Ex. 2 | 0 | Syn. Ex. 27 | Syn. Ex. 41 20 | 250 |
| 41 | Syn. Ex. 2 | 0 | Syn. Ex. 27 | Syn. Ex. 42 30 | 250 |
| 42 | Syn. Ex. 2 | 0 | Syn. Ex. 27 | Syn. Ex. 41 30 | 250 |
| 43 | Syn. Ex. 2 | 0 | Syn. Ex. 26 | Syn. Ex. 41 40 | 250 |
| 44 | Syn. Ex. 2 | 0 | Syn. Ex. 26 | 0 | 280 |
| 45 | Syn. Ex. 2 | 0 | Syn. Ex. 26 | 0 | 280 |

Comparative Example 1

Using the coating varnish obtained in Synthetic Example 26 instead of the coating varnish obtained in Synthetic Example 1, adhesive layers corresponding to the adhesive layers A and B were formed on a surface of the copper plate by the same manner as in Example 1 to produce a comparative adhesive tape. The polyimides in the adhesive layer A and the adhesive layer B of the adhesive tape had each the same glass transition temperature.

Comparative Example 2

A 20 wt. % solution of a polyimide varnish (LARK TPI, produced by MITSUI TOATSU CHEMICALS INC.) prepared by dissolving in N-methyl-2-pyrrolidone was applied to a surface of the same copper plate as that used in Example 1 so as to be a dried thickness of 20 μm, and dried in a hot air circulating oven at 150° C. for 120 minutes to form the adhesive layer A (Tg: 288° C.). Thereafter, the same solution was applied to the adhesive layer formed on the copper plate so as to be a dried thickness of 20 μm, and dried in a hot air circulating oven at 150 ° C. for 120 minutes and additionally at 250° C. for 60 minutes under nitrogen atmosphere to form an adhesive layer corresponding to the adhesive layer B, by which a comparative adhesive tape was obtained.

Comparative Example 3

A 20 wt. % solution of a polyimide varnish (LARK TPI, produced by MITSUI TOATSU CHEMICALS INC.) prepared by dissolving in N-methyl-2-pyrrolidone was applied to a surface of the same copper plate as that used in Example 1 so as to be a dried thickness of 20 μm, and dried in a hot air circulating oven at 150° C. for 120 minutes and additionally at 250° C. for 60 minutes under nitrogen atmosphere to form the comparative adhesive layer A (Tg:288° C.). Thereafter, a coating varnish containing polyether amidoimide obtained in Comparative Synthetic Example 1 was applied to the formed adhesive layer so as to be a dried thickness of 20 μm and dried in a hot air circulating oven at 150° C. for 10 minutes to form the comparative adhesive layer B, thereby a comparative adhesive tape being produced.

Comparative Example 4

A coating varnish containing polyetherimide obtained in Comparative Synthetic Example 2 was applied to a surface of the same copper plate as that used in Example 1 so as to be a dried thickness of 20 μm and dried in a hot air circulating oven at 150° C. for 120 minutes to form the comparative adhesive layer A. Thereafter, a coating varnish which was a 20 wt. % solution of polyimide (Torlon 400T, produced by AMOCO CORP.) in N-methyl-2-pyrrolidone was applied to the adhesive layer formed on the copper plate so as to be a dried thickness of 20 μm, and dried in a hot air circulating oven at 150° C. for 120 minutes to form a comparative adhesive layer B (Tg:230° C.), thereby a comparative adhesive tape being obtained.

Comparative Example 5

A coating varnish containing polyetherimide obtained in Comparative Synthetic Example 2 was applied to a surface of the same copper plate as that used in Example 1 so as to be a dried thickness of 20 μm and dried in a hot air circulating oven at 150° C. for 120 minutes to form the comparative adhesive layer A. Thereafter, a coating varnish which was a 20 wt. % solution of polyamic acid obtained in Comparative Synthetic Example 3 in N-methyl-2-pyrrolidone was applied to the adhesive layer formed on the copper plate so as to be a dried thickness of 20 μm, and dried in a hot air circulating oven at 150° C. for 60 minutes and additionally at 250° C. for 60 minutes under nitrogen atmosphere to form the comparative adhesive layer B, thereby a comparative adhesive tape being obtained.

Regarding comparative adhesive tapes of Comparative Examples 1–5, coating varnishes for the adhesive layers A and B, fillers and amounts thereof, and adhesion temperatures of the adhesive tapes are also shown in Table 6.

TABLE 6

| Comparative Example (Comparative adhesive tape) | Adhesive layer A | | Adhesive layer B | | Adhesion temperature (° C.) |
|---|---|---|---|---|---|
| | Polyimide | Filler (wt. %) | Polyimide | Filler (wt. %) | |
| 1 | Syn. Ex. 26 | 0 | Syn. Ex. 26 | 0 | 280 |
| 2 | Lark TPI | 0 | Lark TPI | 0 | 380 |
| 3 | Lark TPI | 0 | Com. Syn. Ex. 1 | 0 | 310 |
| 4 | Com. Syn. Ex. 2 | 0 | Torlon 400T | 0 | 310 |
| 5 | Com. Syn. Ex. 2 | 0 | Com. Syn. Ex. 3 | 0 | 310 |

In order to evaluate the adhesive tapes obtained in the Examples and Comparative Examples, leadframes were produced according to the following stages (a) and (b).

(Assembling of Leadframe)

A leadframe used in a semiconductor package as shown in FIG. 1 was assembled according to the following procedures.

(a) Punching of Adhesive Tape

The adhesive tape was subjected to punch dying in a desired form by a mold.

(b) Assembling of Leadframe

The adhesive tape punched and a leadframe were positioned and heated under pressure (4 kgf/cm²/2 seconds in nitrogen atmosphere) on a hot plate heated so that the leadframe adhered to the lower Tg adhesive layer of the adhesive tape. The adhesion temperature in this stage is shown in Tables 5 and 6 as adhesion temperature. The conditions of adhesion were different at the time of assembling the leadframe, because the characteristics of the adhesive tapes are different from one another. Here, optimum conditions for each adhesive tape were adopted and the adhesion was carried out based on such conditions.

(Assembling of Semiconductor Package)

Thereafter, the produced leadframe was used to assemble a semiconductor package according to the following stages (c)–(f).

(c) Die Bonding

A semiconductor chip was allowed to adhere to a copper plate (metal plane) with a silver paste for die bonding, which was then cured at 150° C. for 2 hours.

(d) Wire Bonding

Using a wire bonder, a wire pad on the semiconductor chip and a silver plated portion at the end of the inner lead were connected with a gold wire.

(e) Molding

Using an epoxy molding compound, transfer molding was carried out.

(f) Finishing Stage

Via stages of forming, dum cutting, solder plating on the outer leads, etc., the packaging was finished.

(The Results of Evaluations of Adhesive Tapes and Semiconductor Packages (n=10))

(A) Adhesion Strength

A 90° peel strength of 10 mm wide tape at room temperature was measured after the adhesive tape was adhered (taped) onto a copper plate under the same condition at assembling the leadframe. As the result, the adhesive tapes of Examples 1–45 were found to have a strength ranging from 35–50 g/10 mm, while the adhesive tapes of Comparative Examples 3, 4 and 5 had the strength of 10–40 g/10 mm which meant a large variation, though the adhesive tapes of Comparative Examples 1 and 2 had the adhesive strength of 35–50 g/10 mm. In the adhesive tapes of Comparative Examples 3, 4 and 5, some of them caused interfacial separation of the adhesive layer from the other adhesive layer.

(B) Embedding of Lead Pins

The state of lead pins burying in the adhesive tape was observed when the leadframe had been assembled. In the adhesive tape of Examples 1–45, embedding of the lead pins did not change from the state of stage (b) for assembling the leadframe, that is, the lead pins were not embedded beyond the interface of the adhesive layer A and the adhesive layer B. On the contrary, in the comparative adhesive tapes of Comparative Examples 1, 2 and 4, distortion or movement of some of lead pins was observed when the adhesion of the semiconductor chip was carried out in the stage (c), by which the flatness of the lead pins was damaged. In concrete, in case of the adhesive tapes of Comparative Examples 1 and 2, some of the lead pins contacted with the copper plate. In case of the adhesive tapes of Comparative Example 4, the lead pins embedded into the adhesive layer A. In the adhesive tapes of Comparative Examples 3 and 5, the lead pins were not embedded beyond the interface of the adhesive layer A and the adhesive layer B.

(C) Evaluation of Semiconductor Packages

The package obtained as described above were tested using the PCBT Test (Pressure Cooker Biased Test). This test was carried out at 5 volts of applied voltage at 121° C., at 2 atmospheres and at 100% relative humidity, in order to test electrical reliability. As the result, the adhesive tapes of Examples 1–45 did not cause shorting even after 1,000 hours. On the contrary, 3 samples caused shorting in case of the adhesive tape of Comparative Example 1, and 4 samples caused shorting in case of the adhesive tape of Comparative Example 2. Though no shorting took place in case of the adhesive tapes of Comparative Examples 3, 4 and 5, it was observed that the semiconductor packages caused interfacial separation:between the adhesive layer A and the adhesive layer B in each 8 samples thereof.

Example 46

The coating varnish obtained in Synthetic Example 1 was applied to a surface of a copper plate having the thickness of 100 µm by a bar-coater so as to be a dried thickness of 20 µm, and dried in a hot air circulating oven at 150° C. for 60 minutes to form the adhesive layer A on the copper plate. Then, the coating varnish obtained in Synthetic Example 26 (Tg of the polyimide thereof was different from that of Synthetic Example 1) was applied to the surface of the adhesive layer A formed on the copper plate so as to be a dried thickness of 20 µm, and dried in a hot air circulating oven at 150° C. for 10 minutes to form an adhesive layer B. Thereafter, the coating varnish obtained in Synthetic Example 28 (Tg of the polyimide thereof was different from those of Synthetic Examples 1 and 26) was applied to the surface of the adhesive layer B so as to be a dried thickness of 5 µm, and dried in a hot air circulating oven at 150° C. for 10 minutes to produce an adhesive tape having the total thickness of 145 μm which was composed of the adhesive layers A, B and C having each different Tg laminated in order on the copper plate.

EXAMPLE 47–94

Adhesive tapes were produced by the same manner as in Example 46, except that polyimides and bisimide compounds obtained in the above described Synthetic Examples 1–42 were used.

Silica filler having the particle size of 0.07 μm (produced by Arakawa Chemical Industries, Ltd.) was added in an amount of 10% by weight to the adhesive layer A in Example 71 and to the adhesive layer B in Example 72. Alumina filler having the particle size of 0.05 μm (produced by Showa Denko K. K.) was added in an amount of 10% by weight to the adhesive layer B in Example 73.

The coating varnishes used in the adhesive layer B of Examples 74–94 were prepared by dispersing or dissolving the corresponding bisimide compound in the corresponding polyimide solution obtained in each Synthetic Example.

Example 95

An adhesive tape was produced by the same manner as in Example 46, except that a 50 μm thick copper plate was used in place of the 100 μm thick copper plate.

Example 96

An adhesive tape was produced by the same manner as in Example 46, except that a 200 μm thick copper plate was used in place of the 100 μm thick copper plate.

Coating varnishes used for producing the adhesive layers A, B and C in Examples 46–96, bisimide compounds, fillers and amounts thereof, and adhesion temperatures of the adhesive layer B of the formed adhesive tapes (which are the optimum temperature for assembling leadframes) are shown in Table 7.

TABLE 7

| Example (Adhesive tape) | Adhesive layer A | | Adhesive layer B | | Adhesive layer C | Adhesion temperature |
|---|---|---|---|---|---|---|
| | Polyimide | Filler (wt. %) | Polyimide | Filler or bisimide (wt. %) | Polyimide | (° C.) |
| 46 | Syn. Ex. 1 | 0 | Syn. Ex. 26 | 0 | Syn. Ex. 28 | 280 |
| 47 | Syn. Ex. 2 | 0 | Syn. Ex. 26 | 0 | Syn. Ex. 28 | 280 |
| 48 | Syn. Ex. 3 | 0 | Syn. Ex. 26 | 0 | Syn. Ex. 28 | 280 |
| 49 | Syn. Ex. 4 | 0 | Syn. Ex. 26 | 0 | Syn. Ex. 28 | 280 |
| 50 | Syn. Ex. 5 | 0 | Syn. Ex. 26 | 0 | Syn. Ex. 28 | 280 |
| 51 | Syn. Ex. 6 | 0 | Syn. Ex. 26 | 0 | Syn. Ex. 28 | 280 |
| 52 | Syn. Ex. 7 | 0 | Syn. Ex. 26 | 0 | Syn. Ex. 28 | 280 |
| 53 | Syn. Ex. 8 | 0 | Syn. Ex. 26 | 0 | Syn. Ex. 28 | 280 |
| 54 | Syn. Ex. 9 | 0 | Syn. Ex. 26 | 0 | Syn. Ex. 28 | 280 |
| 55 | Syn. Ex. 2 | 0 | Syn. Ex. 10 | 0 | Syn. Ex. 28 | 310 |
| 56 | Syn. Ex. 2 | 0 | Syn. Ex. 11 | 0 | Syn. Ex. 28 | 280 |
| 57 | Syn. Ex. 2 | 0 | Syn. Ex. 12 | 0 | Syn. Ex. 28 | 240 |
| 58 | Syn. Ex. 2 | 0 | Syn. Ex. 13 | 0 | Syn. Ex. 28 | 320 |
| 59 | Syn. Ex. 2 | 0 | Syn. Ex. 14 | 0 | Syn. Ex. 28 | 310 |
| 60 | Syn. Ex. 2 | 0 | Syn. Ex. 15 | 0 | Syn. Ex. 28 | 250 |
| 61 | Syn. Ex. 2 | 0 | Syn. Ex. 16 | 0 | Syn. Ex. 28 | 290 |
| 62 | Syn. Ex. 2 | 0 | Syn. Ex. 17 | 0 | Syn. Ex. 28 | 280 |
| 63 | Syn. Ex. 2 | 0 | Syn. Ex. 18 | 0 | Syn. Ex. 28 | 320 |
| 64 | Syn. Ex. 2 | 0 | Syn. Ex. 19 | 0 | Syn. Ex. 28 | 260 |
| 65 | Syn. Ex. 2 | 0 | Syn. Ex. 20 | 0 | Syn. Ex. 28 | 310 |
| 66 | Syn. Ex. 2 | 0 | Syn. Ex. 21 | 0 | Syn. Ex. 28 | 320 |
| 67 | Syn. Ex. 2 | 0 | Syn. Ex. 23 | 0 | Syn. Ex. 28 | 310 |
| 66 | Syn. Ex. 2 | 0 | Syn. Ex. 24 | 0 | Syn. Ex. 28 | 260 |
| 69 | Syn. Ex. 2 | 0 | Syn. Ex. 27 | 0 | Syn. Ex. 28 | 310 |
| 70 | Syn. Ex. 2 | 0 | Syn. Ex. 12/ Syn. Ex. 25 = 7/3 | 0 | Syn. Ex. 28 | 280 |
| 71 | Syn. Ex. 3 | Silica 10 | Syn. Ex. 26 | 0 | Syn. Ex. 28 | 280 |
| 72 | Syn. Ex. 2 | 0 | Syn. Ex. 26 | Silica 10 | Syn. Ex. 28 | 290 |
| 73 | Syn. Ex. 2 | 0 | Syn. Ex. 26 | Alumina 10 | Syn. Ex. 28 | 290 |
| 74 | Syn. Ex. 2 | 0 | Syn. Ex. 26 | Syn. Ex. 33 10 | Syn. Ex. 30 | 290 |
| 75 | Syn. Ex. 2 | 0 | Syn. Ex. 26 | Syn. Ex. 34 30 | Syn. Ex. 30 | 290 |
| 76 | Syn. Ex. 2 | 0 | Syn. Ex. 26 | Syn. Ex. 35 30 | Syn. Ex. 30 | 290 |
| 77 | Syn. Ex. 2 | 0 | Syn. Ex. 26 | Syn. Ex. 36 30 | Syn. Ex. 30 | 250 |
| 79 | Syn. Ex. 2 | 0 | Syn. Ex. 26 | Syn. Ex. 37 30 | Syn. Ex. 30 | 290 |
| 79 | Syn. Ex. 2 | 0 | Syn. Ex. 26 | Syn. Ex. 38 30 | Syn. Ex. 30 | 300 |
| 80 | Syn. Ex. 2 | 0 | Syn. Ex. 26 | Syn. Ex. 39 30 | Syn. Ex. 30 | 300 |
| 81 | Syn. Ex. 2 | 0 | Syn. Ex. 26 | Syn. Ex. 40 30 | Syn. Ex. 30 | 320 |
| 82 | Syn. Ex. 2 | 0 | Syn. Ex. 26 | Syn. Ex. 37 30 | Syn. Ex. 30 | 250 |
| 83 | Syn. Ex. 2 | 0 | Syn. Ex. 27 | Syn. Ex. 37 20 | Syn. Ex. 30 | 250 |
| 84 | Syn. Ex. 2 | 0 | Syn. Ex. 27 | Syn. Ex. 37 50 | Syn. Ex. 30 | 250 |
| 85 | Syn. Ex. 2 | 0 | Syn. Ex. 27 | Syn. Ex. 41 20 | Syn. Ex. 30 | 250 |
| 86 | Syn. Ex. 2 | 0 | Syn. Ex. 27 | Syn. Ex. 42 30 | Syn. Ex. 30 | 250 |
| 87 | Syn. Ex. 2 | 0 | Syn. Ex. 27 | Syn. Ex. 41 30 | Syn. Ex. 29 | 250 |
| 88 | Syn. Ex. 2 | 0 | Syn. Ex. 26 | Syn. Ex. 41 40 | Syn. Ex. 29 | 250 |
| 89 | Syn. Ex. 2 | 0 | Syn. Ex. 26 | Syn. Ex. 33 10 | Syn. Ex. 31 | 290 |
| 90 | Syn. Ex. 2 | 0 | Syn. Ex. 26 | Syn. Ex. 34 30 | Syn. Ex. 31 | 290 |
| 91 | Syn. Ex. 2 | 0 | Syn. Ex. 26 | Syn. Ex. 35 30 | Syn. Ex. 31 | 290 |
| 92 | Syn. Ex. 2 | 0 | Syn. Ex. 26 | Syn. Ex. 33 10 | Syn. Ex. 32 | 290 |

TABLE 7-continued

| Example | Adhesive layer A | | Adhesive layer B | | Adhesive | Adhesion tempera- |
|---|---|---|---|---|---|---|
| (Adhesive tape) | Polyimide | Filler (wt. %) | Polyimide | Filler or bis-imide (wt. %) | layer C Polyimide | ture (° C.) |
| 93 | Syn. Ex. 2 | 0 | Syn. Ex. 26 | Syn. Ex. 34  30 | Syn. Ex. 32 | 290 |
| 94 | Syn. Ex. 2 | 0 | Syn. Ex. 26 | Syn. Ex. 35  30 | Syn. Ex. 32 | 290 |
| 95 | Syn. Ex. 2 | 0 | Syn. Ex. 26 | 0 | Syn. Ex. 28 | 280 |
| 96 | Syn. Ex. 2 | 0 | Syn. Ex. 26 | 0 | Syn. Ex. 28 | 280 |

Comparative Example 6

Using the coating varnish containing the polyimide obtained in Synthetic Example 26 instead of the coating varnish obtained in Synthetic Example 1, adhesive layers corresponding to the adhesive layers A and B were formed on a surface of the copper plate by the same manner as in Example 46 to produce a comparative adhesive tape in which the adhesive layers contained polyimides having each the same glass transition temperature.

Comparative Example 7

The coating varnish containing polyimide obtained in Synthetic Example 3 was applied to a side of 50 μm thick polyimide film (Upilex 50S, produced by Ube Industries, Ltd.) by a bar-coater so as to be a dried thickness of 20 μm, and dried in a hot air circulating oven at 150° C. for 60 minutes to form an adhesive layer corresponding to the adhesive layer A on the polyimide film. Thereafter, the coating varnish containing polyimide obtained in Synthetic Example 26 was applied to the other side of the polyimide film so as to be a dried thickness of 20 μm, and dried in a hot air circulating oven at 150° C. for 10 minutes to form an adhesive layer corresponding to the adhesive layer B. Thus an adhesive sheet in which adhesive layers having each a different glass transition temperature were formed on both sides of the polyimide film separately was obtained. The resultant adhesive sheet was bonded to the same copper plate as that used in Example 46 under pressure with heat so as to face the adhesive layer corresponding to the adhesive layer A to the copper plate, by which a comparative adhesive tape was obtained. The bonding was carried out by heating to 360° C. under the pressure of 4 kgf/cm² for 2 seconds.

Comparative Example 8

A polyimide varnish (LARK TPI, produced by MITSUI TOATSU CHEMICALS INC.) was dissolved in N-methyl-2-pyrrolidone to prepare a 20 wt. % solution. The resultant solution was applied to a surface of the same copper plate as that used in Example 46 so as to be a dried thickness of 20 μm, and dried in a hot air circulating oven at 150° C. for 120 minutes to form an adhesive layer corresponding to the adhesive layer A (Tg: 288° C.). Thereafter, the same solution was applied to the adhesive layer formed on the copper plate so as to be a dried thickness of 20 μm, and dried in a hot air circulating oven at 150° C. for 120 minutes and additionally at 250° C. for 60 minutes under nitrogen atmosphere to form an adhesive layer corresponding to the adhesive layer B, by which a comparative adhesive tape was obtained.

Comparative Example 9

A polyimide varnish (LARK TPI, produced by MITSUI TOATSU CHEMICALS INC.) was dissolved in N-methyl-2-pyrrolidone to prepare a 20 wt. % solution. The resultant solution was applied to a side of the same polyimide film as that used in Comparative Example 7 so as to be a dried thickness of 20 μm, and dried in a hot air circulating oven at 150° C. for 120 minutes. The same solution was then applied to the other side of the polyimide film so as to be a dried thickness of 20 μm and dried in a hot air circulating oven at 150° C. for 120 minutes to form an adhesive layer (Tg: 288° C.), followed by additionally drying at 2!50° C. for 60 minutes to produce an adhesive sheet. The resultant adhesive sheet was placed on a surface of the same copper plate as that used in Example 46 and bonded under pressure with heat in a nitrogen atmosphere to produce a comparative adhesive tape. The bonding was carried out by heating to 360° C. under the pressure of 4 kgf/cm² for 2 seconds.

Comparative Example 10

A polyimide varnish (LARK TPI, produced by MITSUI TOATSU CHEMICALS INC.) was dissolved in N-methyl-2-pyrrolidone to prepare a 20 wt. % solution. The resultant solution was applied to a surface of the same copper plate as that used in Example 46 so as to be a dried thickness of 20 μm, and dried in a hot air circulating oven at 150° C. for 120 minutes and additionally at 250° C. for 60 minutes in a nitrogen atmosphere to form an adhesive layer corresponding to the adhesive layer A (Tg: 280° C. ). Thereafter, a coating varnish containing polyether amidoimide obtained in Comparative Example 1 was applied to the adhesive layer formed on the copper plate so as to be a dried thickness of 20 μm, and dried in a hot air circulating oven at 150° C. for 10 minutes to form an adhesive layer corresponding to the adhesive layer B, by which a comparative adhesive tape was obtained.

Comparative Example 11

A coating varnish containing polyimide obtained in Comparative Synthetic Example 2 was applied to a surface of the same copper plate as that used in Example 46 so as to be a dried thickness of 20 μm, and dried in a hot air circulating oven at 150° C. for 120 minutes to form an adhesive layer corresponding to the adhesive layer A. Thereafter, a coating varnish which was a 20 wt. % solution of polyimide (Torlon 400T, produced by AMOCO CORP.) in N-methyl-2-pyrrolidone was applied to the adhesive layer formed on the copper plate so as to be a dried thickness of 20 μm, and dried in a hot air circulating oven at 150° C. for 120 minutes to form an adhesive layer corresponding to the adhesive layer B (Tg: 230° C.), by which a comparative adhesive tape was obtained.

Comparative Example 12

A coating varnish containing polyimide obtained in Comparative Synthetic Example 2 was applied to a surface of the same copper plate as that used in Example 46 so as to be a dried thickness of 20 μm, and dried in a hot air circulating oven at 150° C. for 120 minutes to form an adhesive layer corresponding to the adhesive layer A. Thereafter, a coating varnish which was a 20 wt. % solution of polyamic acid obtained in Comparative Synthetic Example 3 in N-methyl-2-pyrrolidone was applied to the adhesive layer formed on the copper plate so as to be a dried thickness of 20 μm, and dried in a hot air circulating oven at 150° C. for 60 minutes and additionally at 250° C. for 60 minutes in a nitrogen atmosphere to form an adhesive layer corresponding to the adhesive layer B, by which a comparative adhesive tape was obtained.

Comparative Example 13

Using polyimide produced in Synthetic Example 28, the adhesive layer C was formed on the adhesive layer B of the adhesive tape produced in Comparative Example 12 by the same manner as in Example 46 to produce a comparative adhesive tape.

Regarding comparative adhesive tapes of Comparative Examples 6–13, coating varnishes for the adhesive layers, fillers and amounts thereof, and adhesion temperatures of the formed adhesive tapes are also shown in Table 8.

in nitrogen atmosphere) because temporary adhesion was not carried out. (Assembling of Semiconductor Package)

Thereafter, semiconductors were assembled by the same manner as the case of FIG. 1 using the above mentioned leadframes.
(The Results of Evaluations of Adhesive Tapes and Semiconductor Packages (n=10))
(A) Time Required For Assembling The Leadframe In case of using adhesive tapes of Examples 46–96 and Comparative Examples 6 and 13, the assembling of the leadframe required 5 seconds for temporary adhesion, 4 seconds for main adhesion and the total of 9 seconds, which required 20 seconds/10 samples including tact time. To the contrary, in case of using adhesive tapes of Comparative Examples 7–12 which did not have the adhesive layer C, the assembling required 20 seconds for adhesion and 40 seconds/10 samples including tact time, which meant about twice longer than that required in the above case.
(B) Adhesion Strength A 90° peel strength of 10 mm wide tape at room temperature was measured after the adhesive tape was adhered (taped) onto a copper plate under the same condition at assembling the leadframe (the taping was conducted by adhesion under pressure after temporary adhesion in case of using the adhesive tape having the adhesive layer C, and by

TABLE 8

| Comparative Example (Comparative adhesion tape) | Adhesive layer A | | Adhesive layer B | | Adhesive layer C | Adhesion temperature (° C.) |
|---|---|---|---|---|---|---|
| | Polyimide | Filler (wt. %) | Polyimide | Filler (wt. %) | Polyimide | |
| 6 | Syn. Ex. 26 | 0 | Syn. Ex. 26 | 0 | Syn. Ex. 28 | 280 |
| 7 | Syn. Ex. 3 | 0 | Syn. Ex. 26 | 0 | — | 280 |
| 8 | Lark TPI | 0 | Lark TPI | 0 | — | 380 |
| 9 | Lark TPI | 0 | Lark TPI | 0 | — | 380 |
| 10 | Lark TPI | 0 | Com. Syn. Ex. 1 | 0 | — | 310 |
| 11 | Com. Syn. Ex. 2 | 0 | Torlon 400T | 0 | — | 310 |
| 12 | Com. Syn. Ex. 2 | 0 | Com. Syn. Ex. 3 | 0 | — | 310 |
| 13 | Com. Syn. Ex. 2 | 0 | Com. Syn. Ex. 3 | 0 | Syn. Ex. 28 | 310 |

(Assembling of Leadframe)

In order to evaluate the adhesive tapes obtained in the Examples and Comparative Examples, leadframes used for the semiconductor package shown in FIG. 2 were produced by the same manner as that for the FIG. 1 except that the stage (b) was conducted as follows.

Every pieces of the adhesive tape punched were positioned on the leadframes and they were temporarily adhered thereto by heating under pressure (150° C./2 kgf/cm²/0.5 second in nitrogen atmosphere) on a hot plate heated. In case of the adhesive tapes of Examples 46–96, Comparative Examples 6 and 13 which had the adhesive layer C, the leadframes (including 5 pieces) were allowed to adhere at a time (4 kgf/cm²/2 seconds in nitrogen atmosphere) after the above mentioned temporary adhesion. The adhesion temperature in this stage is shown in Tables 7 and 8 as adhesion temperature. The conditions of adhesion were different at the time of assembling the leadframe, because the characteristics of the adhesive tapes are different one another. Here, optimum conditions for each adhesive tape were adopted and the adhesion was carried out based on such conditions. The adhesion was carried out under the optimum condition for each adhesive tape. In case of the adhesive tapes of Comparative Examples 7–12 which did not have the adhesive layer C, adhesion was carried out every piece at the adhesion temperature shown in Table 8 (4 kgf/cm²/2 seconds only adhesion under pressure in case of using the adhesive tape having no adhesive layer C.). As the result, the adhesive tapes of Examples 46–96 were found to have a strength ranging from 35–50 g /10 mm, while the adhesive tapes of Comparative Examples 7 and 9–13 had the strength of 10–40 g/10 mm which meant a large variation, though the adhesive tapes of Comparative Examples 6 and 8 had the adhesive strength of 35–50 g/10 mm. The adhesive tapes of Comparative Examples 7 and 9 caused interfacial separation of the adhesive layer from the base film and the adhesive tapes of Comparative Examples 10–13 caused interfacial separation between the adhesive layers.
(C) Embedding of Lead Pins The state of lead pins burying in the adhesive tape was observed when the leadframe had been assembled. In the adhesive tape of Examples 46–96, embedding of the lead pins did not change from the state of stage (b) for assembling the leadframe, that is, the lead pins were not embedded beyond the interface of the adhesive layer A and the adhesive layer B. On the contrary, in the comparative adhesive tapes of Comparative Examples 6, 8 and 11, distortion or movement of some of lead pins was observed when the adhesion of the semiconductor chip was carried out in the stage (c), by which the flatness of the lead pins was damaged. In concrete, in case of the adhesive tapes of Comparative Examples 6 and 8, some of the lead pins contacted with the copper plate. In case of the adhesive tapes of Comparative Example 11, the lead pins embedded into the adhesive layer A. In the adhesive tapes of Comparative Examples 7 and 9, the lead pins were not embedded beyond the polyimide film. In the adhesive tapes of Comparative Examples 10, 12 and 13, the lead pins were not embedded beyond the interface of the adhesive layer A and the adhesive layer B.

(D) Evaluation of Semiconductor Packages

The package obtained as described above were tested using the above-mentioned PCBT Test. As the result, the adhesive tapes of Examples 46–96 did not cause shorting even after 1000 hours. On the contrary, 3 samples caused shorting in case of the adhesive tape of Comparative Example 6, and 4 samples caused shorting in case of the adhesive tape of Comparative Example 8. In case of the adhesive tapes of Comparative Examples 7 and 9–13, no shorting took place in the semiconductor packages. However, interfacial separation was observed between the polyimide film and the adhesive layers in 8 samples of the adhesive tapes of Comparative Examples 7 and 9 and between the adhesive layer corresponding to the adhesive layer A and the adhesive layer corresponding to the adhesive layer B in 8 samples of the adhesive tapes of Comparative Examples 10–13.

As is clear from the results described above, in the case of the adhesive tapes of the present invention, the semiconductor package can be produced in a good manner. In contrast, the adhesive tapes of Comparative Examples are not suitable for manufacturing electronic parts because of causing troubles that the lead pins are embedded in the adhesive layers, shorting is caused by the test for electrical reliability, or the adhesive tape has large variation of adhesive strength.

What is claimed is:

1. An adhesive tape for electronic parts which comprises a metal substrate and an adhesive layer A and an adhesive layer B laminated in order on at least a surface of said metal substrate, wherein said layer adhesive A comprises a polyimide consisting of 100–20% by mol of the repeating unit represented by the following formula (1a) and 0–80% by mol of the repeating unit represented by the following formula (1b), said adhesive layer B comprises a polyimide consisting of 100–40% by mol of the repeating unit represented by the following formula (1a) and 0–60% by mol of the repeating unit represented by the following formula (2), and the adhesive layer A and the adhesive layer B have each a different glass transition temperature:

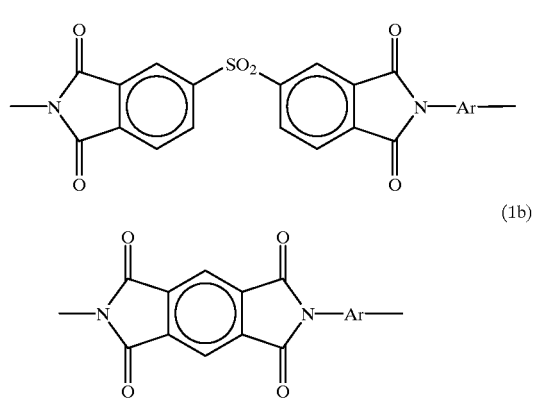

wherein Ar represents a divalent group selected from the following formulas containing aromatic rings:

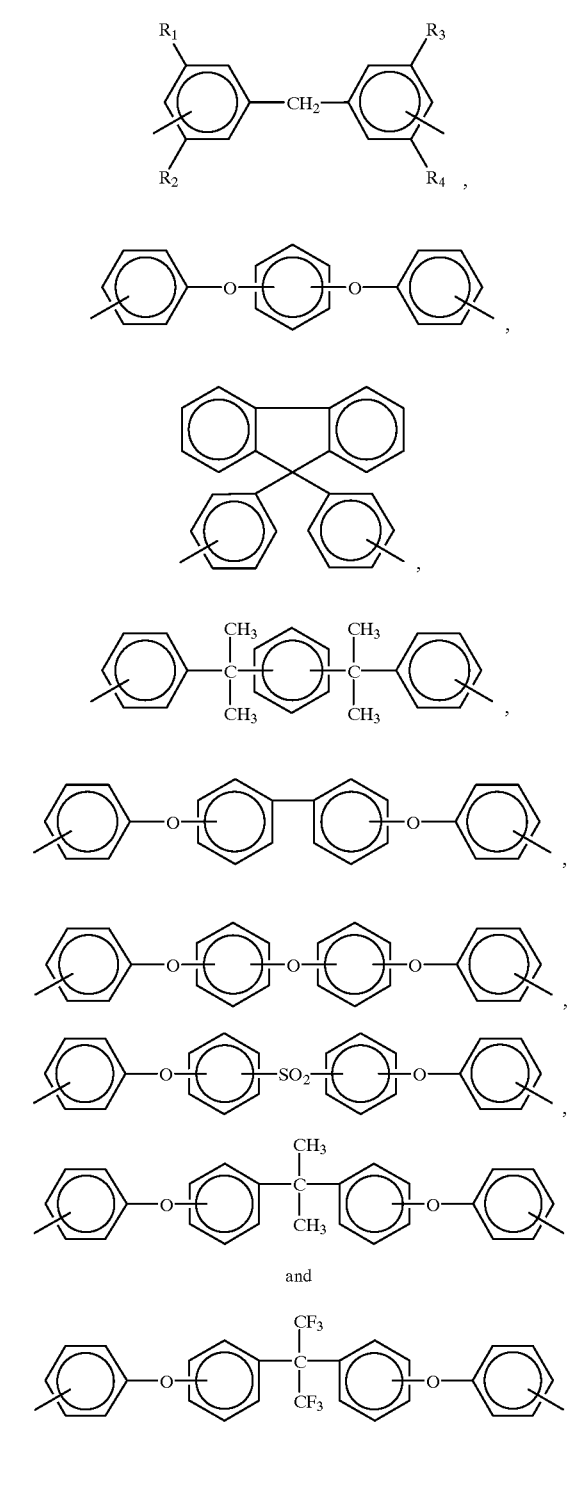

wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time:

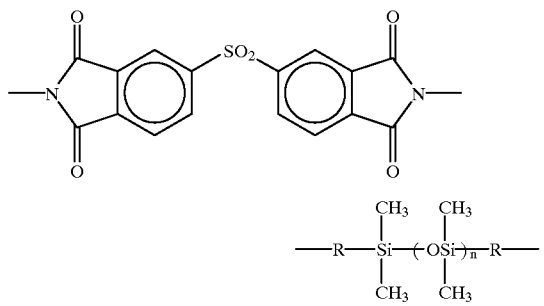

(2)

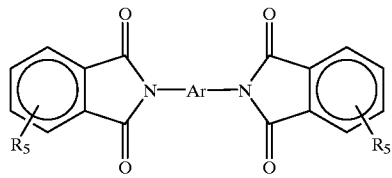

wherein R is an alkylene group having 1 to 10 carbon atoms or —$CH_2OC_6H_4$—, the methylene group of which attaches to Si, and n means an integer of 1 to 20.

2. The adhesive tape for electronic parts according to claim 1, wherein said adhesive B contains at least a bisimide compound selected from compounds represented by the following formulas (4a) and (4b):

(4a)

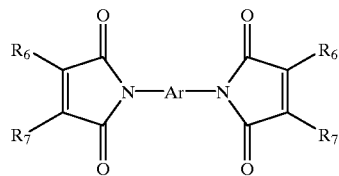

(4b)

wherein Ar has the same meaning as described above, $R_5$, $R_5$ and $R_7$ which are identical or different represent each a hydrogen atom, a chlorine atom, a bromine atom, a carboxyl group, an alkyl group having 1–4 carbon atoms or an alkoxy group having 1–4 carbon atoms.

3. The adhesive tape for electronic parts according to claim 1, wherein the glass transition temperature of the adhesive layer A is higher than that of the adhesive layer B.

4. The adhesive tape for electronic parts according to claim 3, wherein the glass transition temperature of the adhesive layer A is at least 40° C. higher than that of the adhesive 3 layer B.

5. The adhesive tape for electronic parts according to claim 1, wherein at least one of the adhesive layer A and the adhesive layer B contains 0.1–50% by weight of a filler having a particle size of 1 μm or less.

6. The adhesive tape for electronic parts according to claim 1, wherein a releasing film is provided on the exposed surface of the adhesive layer B.

7. The adhesive tape for electronic parts according to claim 1, wherein the metal substrate has a thickness of from 10 to 300 μm.

8. The adhesive tape for electronic parts according to claim 1, wherein the metal substrate is composed of at least one selected from the group consisting of copper, cupronickel, silver, iron, alloy 42 and stainless steel.

* * * * *